United States Patent
Matsuyama et al.

(10) Patent No.: US 11,979,097 B2
(45) Date of Patent: May 7, 2024

(54) POWER CONVERSION DEVICE

(71) Applicant: DAIKIN INDUSTRIES, LTD., Osaka (JP)

(72) Inventors: Ryou Matsuyama, Osaka (JP); Masaki Kono, Osaka (JP); Tomoisa Taniguchi, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 106 days.

(21) Appl. No.: 17/378,979

(22) Filed: Jul. 19, 2021

(65) Prior Publication Data

US 2021/0344281 A1 Nov. 4, 2021

Related U.S. Application Data

(63) Continuation of application No. PCT/JP2020/003504, filed on Jan. 30, 2020.

(30) Foreign Application Priority Data

Jan. 30, 2019 (JP) ................................ 2019-014071

(51) Int. Cl.
*H02M 1/32* (2007.01)
*G05F 1/571* (2006.01)
(Continued)

(52) U.S. Cl.
CPC ..... *H02M 7/53871* (2013.01); *H02M 1/0006* (2021.05); *H02M 1/32* (2013.01);
(Continued)

(58) Field of Classification Search
CPC ......... G05F 1/571; H02M 1/32; H02M 5/453; H02M 5/458
See application file for complete search history.

(56) References Cited

U.S. PATENT DOCUMENTS

2004/0246641 A1* 12/2004 Sugimoto ............. H02M 5/458
361/91.1
2008/0094864 A1* 4/2008 Sekimoto ................ H02M 1/32
363/36
(Continued)

FOREIGN PATENT DOCUMENTS

EP 2 654 162 A2 10/2013
JP 9-182450 A 7/1997
(Continued)

OTHER PUBLICATIONS

Hinkkanen et al., "Induction Motor Drives Equipped With Diode Rectifier and Small DC-Link Capacitance," Power Electronics Laboratory, Helsinki University of Technology, Finland, IEEE, pp. 1498-1503, 6 pages.
(Continued)

*Primary Examiner* — Gary A Nash
(74) *Attorney, Agent, or Firm* — BIRCH, STEWART, KOLASCH & BIRCH, LLP

(57) ABSTRACT

A converter circuit converts AC electric power into DC power. An inverter circuit converts the DC power into AC power. A capacitor is connected in parallel to each of the converter circuit and the inverter circuit between these circuits. The capacitor allows variation of an output voltage from the converter circuit, and absorbs variation of an output voltage from the inverter circuit due to a switching operation. An overvoltage protection circuit includes a resistor and a semiconductor element connected in series to each other. The overvoltage protection circuit is connected in parallel to the capacitor to protect the inverter circuit from an overvoltage. First and second control units respectively control the inverter circuit and the overvoltage protection circuit.

26 Claims, 18 Drawing Sheets

(51) Int. Cl.
    *H02M 1/00*      (2006.01)
    *H02M 5/453*     (2006.01)
    *H02M 5/458*     (2006.01)
    *H02M 7/04*      (2006.01)
    *H02M 7/217*     (2006.01)
    *H02M 7/5387*    (2007.01)
    *H03K 17/081*    (2006.01)

(52) U.S. Cl.
    CPC ........... *H02M 7/05* (2021.05); *H02M 7/2173* (2013.01); *H03K 17/08104* (2013.01); *G05F 1/571* (2013.01); *H02M 5/453* (2013.01); *H02M 5/458* (2013.01)

(56) References Cited

U.S. PATENT DOCUMENTS

| | | | |
|---|---|---|---|
| 2011/0074364 A1* | 3/2011 | Nakajima | H02M 1/32 322/19 |
| 2014/0203755 A1* | 7/2014 | Becerra | H02M 5/458 318/812 |
| 2014/0265987 A1 | 9/2014 | Chretien et al. | |
| 2014/0368143 A1* | 12/2014 | Breitzmann | H02M 7/5387 318/380 |
| 2016/0268951 A1* | 9/2016 | Cho | H02M 5/458 |
| 2016/0303948 A1 | 10/2016 | Sakai et al. | |
| 2016/0327998 A1* | 11/2016 | Webster | G06F 1/26 |
| 2016/0329824 A1* | 11/2016 | Sugahara | H02H 3/05 |
| 2018/0097440 A1 | 4/2018 | Wang | |
| 2018/0278144 A1 | 9/2018 | Nakano et al. | |
| 2020/0021232 A1 | 1/2020 | Iwazaki et al. | |
| 2021/0119565 A1 | 4/2021 | Iwazaki et al. | |

FOREIGN PATENT DOCUMENTS

| | | | | |
|---|---|---|---|---|
| JP | 2011-78216 A | | 4/2011 | |
| JP | 2012-151974 A | | 8/2012 | |
| JP | 2014-131446 A | | 7/2014 | |
| JP | 2015-216746 A | | 12/2015 | |
| JP | 2015216746 A | * | 12/2015 | |
| JP | 2018-82525 A | | 5/2018 | |
| JP | 2018082525 A | * | 5/2018 | |
| WO | WO 2015/088937 A1 | | 7/2015 | |
| WO | WO 2016/121832 A1 | | 8/2016 | |
| WO | WO 2017/098836 A1 | | 6/2017 | |
| WO | WO2018/078851 A1 | | 5/2018 | |
| WO | WO 2018/113388 A1 | | 6/2018 | |

OTHER PUBLICATIONS

International Preliminary Report on Patentability and English translation of the Written Opinion of the International Searching Authority for International Application No. PCT/JP2020/003504, dated Aug. 12, 2021.

International Search Report (PCT/ISA/210) issued in PCT/JP2020/003504, dated Apr. 28, 2020.

Extended European Search Report for European Application No. 20748922.0, dated Jul. 22, 2022.

* cited by examiner

POWER CONVERSION DEVICE

CROSS REFERENCE TO RELATED APPLICATIONS

This application is a Continuation of PCT International Application No. PCT/JP2020/003504, filed on Jan. 30, 2020, which claims priority under 35 U.S.C. 119(a) to Patent Application No. 2019-014071, filed in Japan on Jan. 30, 2019, all of which are hereby expressly incorporated by reference into the present application.

TECHNICAL FIELD

The present disclosure relates to a power conversion device.

BACKGROUND ART

A power conversion device is provided between an alternating-current (AC) power source and a load to supply a predetermined amount of AC power to the load. Patent Document 1 discloses a technique relating to such a power conversion device.

A power conversion device of Patent Document 1 includes a converter circuit, a smoothing capacitor, a braking circuit, and an inverter circuit.

CITATION LIST

Patent Documents

[Patent Document 1] WO2017/098836

SUMMARY

A first aspect of the present disclosure is directed to a power conversion device including: a converter circuit (20) configured to convert AC electric power output from an AC power source (1) into DC power; an inverter circuit (40) including a plurality of switching elements (41a to 46a), and configured to convert the DC power into AC power to supply the AC power to a load; a capacitor (31) connected in parallel to each of the converter circuit (20) and the inverter circuit (40) between the converter circuit (20) and the inverter circuit (40), the capacitor (31) allowing variation of an output voltage from the converter circuit (20), the capacitor (31) absorbing variation of an output voltage from the inverter circuit (40) due to a switching operation; an overvoltage protection circuit (50) including a resistor (51) and a semiconductor element (52) connected in series to each other, the overvoltage protection circuit (50) being connected in parallel to the capacitor (31), the overvoltage protection circuit (50) being configured to protect the inverter circuit (40) from an overvoltage applied to the inverter circuit (40); and a control circuit (60, 70) configured to control the inverter circuit (40) and the overvoltage protection circuit (50).

DESCRIPTION OF EMBODIMENTS

First Embodiment

<Outline>

Figure 1:
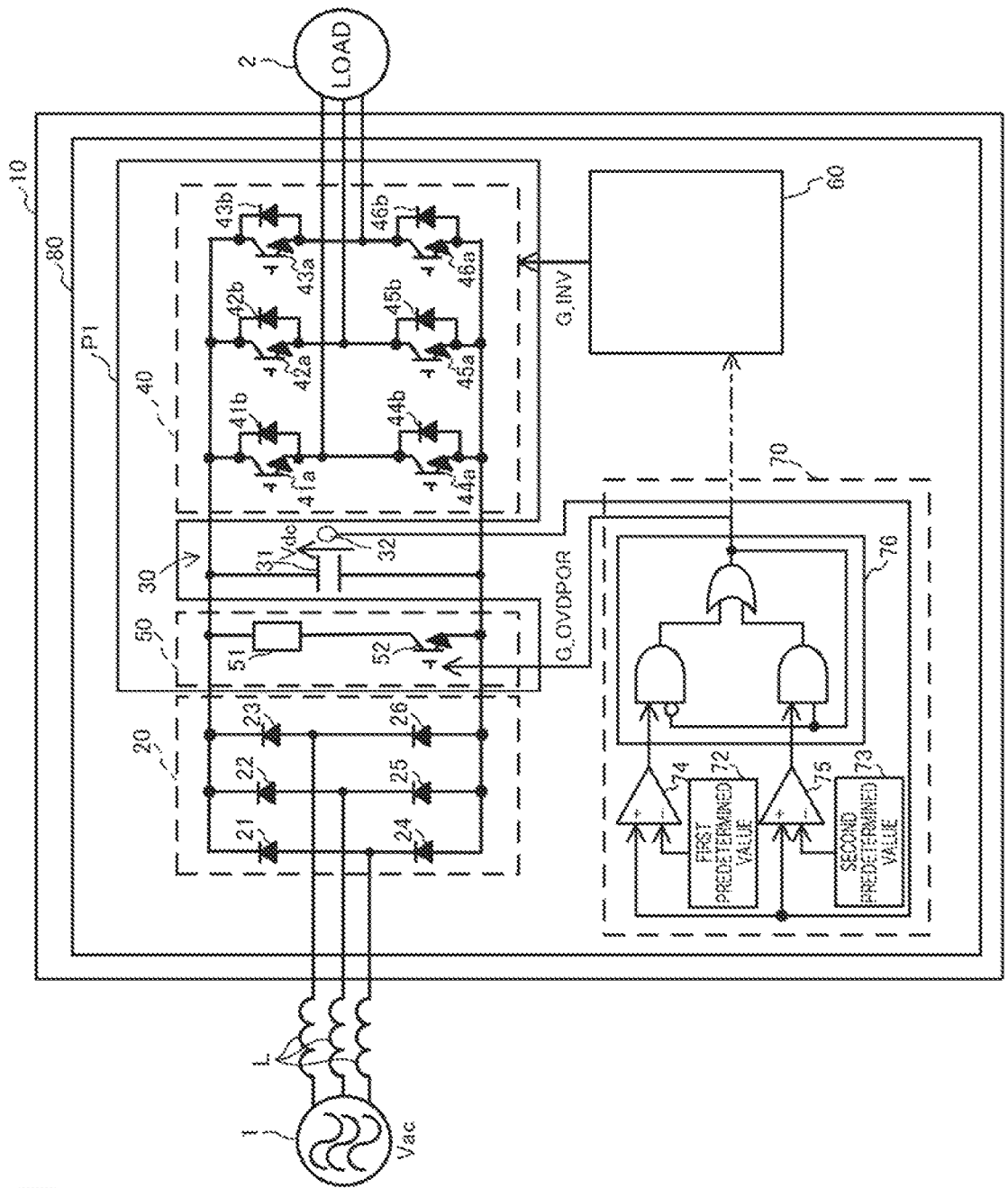
FIG. 1 is a circuit diagram of a power conversion device according to a first embodiment.

FIG. 1 is a circuit diagram of a power conversion device (10) according to this first embodiment. The power conversion device (10) is connected to an AC power source (1) and a load (2).

FIG. 1 illustrates a situation where the AC power source (1) is a three-phase AC power source. In this first embodiment, the load (2) is a magnet motor of a compressor in a refrigerant circuit of an air conditioner. The load (2) may be a motor or transformer of a system that does not need to include a regenerative brake.

The power conversion device (10) receives three-phase electric power from the AC power source (1). The power conversion device (10) converts this electric power into AC power with a desired frequency and voltage, and supplies the AC power to the load (2). As a result, the load (2) operates.

<Configurations>

As illustrated in FIG. 1, the power conversion device (10) includes a converter circuit (20), a direct-current (DC) link unit (30), an inverter circuit (40), an overvoltage protection circuit (50), and first and second control units (60) and (70) serving as a control circuit.

—Converter Circuit—

The converter circuit (20) has a plurality of semiconductor elements. The converter circuit (20) converts electric power output from the AC power source (1) into DC power.

This first embodiment exemplifies a situation where the converter circuit (20) is a full-wave rectifier circuit. The converter circuit (20) includes six diodes (21 to 26) as the semiconductor elements. The six diodes (21 to 26) are connected in a bridge configuration.

—DC Link Unit—

The DC link unit (30) is located between the converter circuit (20) and the inverter circuit (40), and includes a capacitor (31). The capacitor (31) is connected between a pair of output nodes of the converter circuit (20), and is connected in parallel to each of the converter circuit (20) and the inverter circuit (40).

The capacitor (31) receives a DC voltage according to the DC power from the converter circuit (20). The capacitor (31) uses this DC voltage to generate a DC link voltage (Vdc). The DC link voltage (Vdc) pulsates according to the frequency of a power supply voltage (Vac) according to the electric power.

The reason why the DC link voltage (Vdc) contains a ripple component according to the frequency of the power supply voltage (Vac) will be described. The capacitance value of the capacitor (31) is set such that the ripple voltage due to a switching operation of the inverter circuit (40) is successfully reduced though the output voltage from the converter circuit (20) can hardly be smoothed. The ripple voltage is the voltage variation according to the switching frequency of switching elements (41a to 46a).

In short, the capacitor (31) allows variation of the output voltage from the converter circuit (20), and absorbs variation of the output voltage from the inverter circuit (40) due to the switching operation. Specifically, the capacitance of the capacitor (31) is set such that the voltage variation of the capacitor (31) during a switching period is 1/10 or less of the average voltage of the capacitor (31). Thus, the minimum necessary capacitance of the capacitor (31) depends on the switching frequency and the load current flowing between the load (2) and the capacitor (31).

By setting the capacitance value C of the capacitor (31) to satisfy the following formula (A), the voltage variation of the capacitor (31) during the switching period can be 1/10 or less of the average voltage of the capacitor (31). In the formula (A), output voltage variation of the converter circuit (20) superimposed on the DC link voltage (Vdc) is ignored, VAdc represents the average DC link voltage (Vdc), Imax represents the peak value of the load current obtained while the AC power is maximum, and Ts represents the switching period.

$$C \geq (10 \cdot Imax \cdot Ts)/VAdc \quad (A)$$

Here, the switching period is a period by which the switching elements (41a to 46a) are repeatedly turned on off. In this first embodiment, the switching elements (41a to 46a) are controlled by pulse width modulation (PWM). Thus, the switching period corresponds to a carrier period.

The capacitance value C of the capacitor (31) is determined to satisfy the following formula (1) based on the power supply voltage (Vac) and the maximum power (Pmax) of the AC power output from the inverter circuit (40).

[Formula 2]

$$C \leq 350 \times 10^{-6} \times \frac{Pmax}{Vac^2} \quad (1)$$

The following formula (2) is further satisfied.

$$C(Vc1^2 - Vc2^2)/2 < E \quad (2)$$

where C represents the capacitance of the capacitor (31), Vc1 represents the withstand voltage of the capacitor (31), Vc2 represents the peak voltage of the capacitor (31) during the switching operation, and E represents the maximum magnetic energy that can be stored in the inductance component of the load (2).

A typical power conversion device includes an electrolytic capacitor as a smoothing capacitor for smoothing the output voltage from the converter circuit (20). In contrast, the capacitance value of the capacitor (31) of this embodiment is about 0.01 times that of the smoothing capacitor, and is actually about several tens of μF (microfarad). The capacitor (31) is configured as, for example, a film capacitor.

Since the capacitor (31) has a relatively small capacitance, the DC link unit (30) hardly smoothes the output voltage from the converter circuit (20). As a result, the ripple component according to the frequency of the power supply voltage (Vac) remains in the DC link voltage (Vdc). In this first embodiment, the AC power source (1) is a three-phase power source. Thus, the ripple component according to the frequency of the power supply voltage (Vac) has a frequency that is six times that of the power supply voltage.

The DC link unit (30) further includes a voltage detector (32). The voltage detector (32) is a sensor near the capacitor (31), and detects the DC link voltage (Vdc).

—Inverter Circuit—

A pair of input nodes of the inverter circuit (40) are respectively connected to both ends of the capacitor (31). The inverter circuit (40) includes the switching elements (41a to 46a) and a plurality of freewheeling diodes (41b to 46b). The switching elements (41a to 46a) include a plurality of upper-arm switching elements (41a to 43a) and a plurality of lower-arm switching elements (44a to 46a). The upper-arm switching elements (41a to 43a) are each connected in series to an associated one of the lower-arm switching elements (44a to 46a). The midpoints between the upper-arm switching elements (41a to 43a) and the associated lower-arm switching elements (44a to 46a) are each connected to an associated one of phase coils (a U-phase coil, a V-phase coil, and a W-phase coil) of the load (2), and constitute output nodes of the inverter circuit (40). The output current from the inverter circuit (40) flowing from the inverter circuit (40) to the U-phase of the load (2) is hereinafter referred to as the "U-phase current Iu," the output current from the inverter circuit (40) flowing from the inverter circuit (40) to the V-phase of the load (2) as the "V-phase current Iv," and the output current of the inverter circuit (40) flowing from the inverter circuit (40) to the W-phase of the load (2) as the "W-phase current Iw."

The DC link voltage (Vdc) is applied as an input voltage to the inverter circuit (40). The inverter circuit (40) converts DC power according to the DC link voltage (Vdc) into AC power by the switching operation, and supplies the AC power to the load (2). Here, the switching operation of the inverter circuit (40) is an operation for turning the switching elements (41a to 46a) on and off.

The switching elements (41a to 46a) is mainly made of a wide-bandgap semiconductor containing silicon carbide (SiC), gallium nitride (GaN), or diamond (C).

—Overvoltage Protection Circuit—

The overvoltage protection circuit (50) is located between the converter circuit (20) and the DC link unit (30), and is connected in parallel to each of the converter circuit (20) and the capacitor (31). The overvoltage protection circuit (50) includes a resistor (51) and a semiconductor element (52). The resistor (51) and the semiconductor element (52) are connected in series to each other.

The overvoltage protection circuit (50) protects the inverter circuit (40) upon application of the DC link voltage (Vdc) as an overvoltage to the inverter circuit (40).

The resistance of the resistor (51) is set to be lower than that of the braking circuit of WO 2017/098836. The resistance is determined in accordance with the current flowing from the load (2) back to the inverter circuit (40) during suspension of the switching operation, i.e., the magnetic energy stored in the inductance component of the load (2).

The semiconductor element (52) is a switching element. The switching element (52) is mainly made of a wide-bandgap semiconductor containing silicon carbide (SiC), gallium nitride (GaN), or diamond (C).

The wide-bandgap semiconductor can operate even at high temperatures of about 200° C. The overvoltage protection circuit (50) can convert energy of an overvoltage into heat even while having a relatively small size.

—First Control Unit—

The first control unit (60) includes various elements, a microcomputer, and a memory. Output terminals of the first control unit (60) are connected to gate terminals of the switching elements (41a to 46a) of the inverter circuit (40).

The first control unit (60) outputs control signals (G_INV) to the inverter circuit (40) to control the switching operation for the switching elements (41a to 46a). Examples of this control include control allowing the rotational speed of the load (2) to be closer to a desired rotational speed. The first control unit (60) controls the switching elements (41a to 46a) by PWM in response to switching signals responsive to the result of comparison between a modulated waveform in each phase and a predetermined triangular carrier waveform. Specifically, the modulated waveform having a greater value than the carrier waveform would turn the upper-arm switching elements (41a to 43a) on, and would turn the lower-arm switching elements (44a to 46a) off. In contrast, the modulated waveform having a smaller value than the carrier waveform would turn the upper-arm switching elements (41a to 43a) off, and would turn the lower-arm switching elements (44a to 46a) on.

—Second Control Unit—

The second control unit (70) has one input terminal. This input terminal receives the DC link voltage (Vdc) detected by the voltage detector (32).

The second control unit (70) has one output terminal. This output terminal is connected to an input terminal of the semiconductor element (52) of the overvoltage protection circuit (50). The second control unit (70) controls the overvoltage protection circuit (50).

The second control unit (70) includes two setters (72, 73), two comparators (74, 75), and one determination unit (76).

The setter (72) sets, and stores, a first predetermined value. The setter (73) sets, and stores, a second predetermined value. The first and second predetermined values are threshold voltages, and are used to control operation of the semiconductor element (52). The second predetermined value is set to be lower than the first predetermined value.

The comparator (74) has two input terminals. One of the input terminals is connected to the setter (72), and the other input terminal is connected to the voltage detector (32). The comparator (74) compares the first predetermined value with the DC link voltage (Vdc), which is the detection result of the voltage detector (32).

The comparator (75) has two input terminals. One of the input terminals is connected to the setter (73), and the other input terminal is connected to the voltage detector (32). The comparator (75) compares the second predetermined value with the DC link voltage (Vdc).

The determination unit (76) has two input terminals. Each of the two input terminals is connected to an output terminal of an associated one of the comparators (74, 75). The determination unit (76) uses output signals from the comparators (74, 75) to perform a logical operation. An output terminal of the determination unit (76) is connected to the input terminal of the semiconductor element (52), and an actuating signal (G_OVDPOR) output by the determination unit (76) is applied to the semiconductor element (52). The semiconductor element (52) is turned on to activate the overvoltage protection circuit (50). Alternatively, the semiconductor element (52) is turned off to deactivate the overvoltage protection circuit (50).

<Operation>

Figure 2:
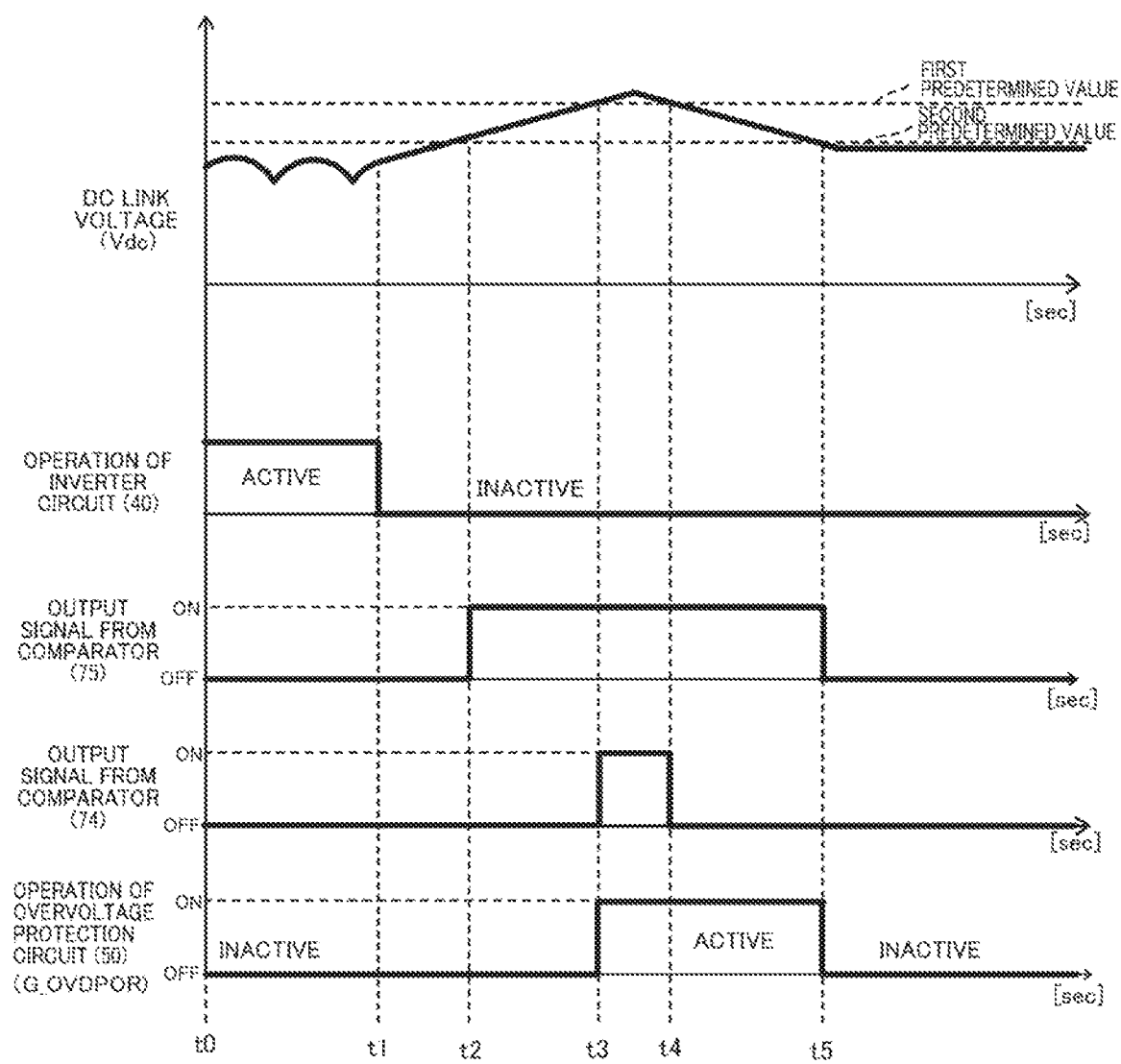
FIG. 2 is a timing chart showing how circuits operate in the first embodiment.

How circuits included in the power conversion device (10) operate will be described with reference to the timing chart of FIG. 2. FIG. 2 shows changes in the DC link voltage (Vdc), the operation of the inverter circuit (40), the output signal from each comparator (74, 75), and the operation of the overvoltage protection circuit (50) over time.

From time t0 to time t1, the inverter circuit (40) performs the switching operation. During this period, the DC link voltage (Vdc) applied to the inverter circuit (40) is lower than the second predetermined value, and is stable. During this period, the output signals from the two comparators (74, 75) are all "OFF." Thus, the actuating signal (G_OVDPOR) output by the determination unit (76) is "OFF." This allows the overvoltage protection circuit (50) to be inactive.

Suppose that at time t1, the first control unit (60) switches the control signals (G_INV) from "ON" to "OFF" to stop the switching operation of the inverter circuit (40). In this first embodiment, all the switching elements (41a to 46a) of the inverter circuit (40) are off while the switching operation is stopped. Regeneration of the magnetic energy in the load (2) starts increasing the DC link voltage (Vdc).

Suppose that at time t2, the DC link voltage (Vdc) exceeds the second predetermined value. The comparator (75) switches its output signal from "OFF" to "ON."

Suppose that as a result of a further continuous increase in the DC link voltage (Vdc), the DC link voltage (Vdc) becomes higher than or equal to the first predetermined value at time t3. The comparator (74) switches its output signal from "OFF" to "ON."

At time t3, the output signals fed from the comparators (74, 75) to the determination unit (76) are all turned "ON." The determination unit (76) switches the actuating signal (G_OVDPOR) from "OFF" to "ON." Upon receipt of the actuating signal (G_OVDPOR), the semiconductor element (52) is turned on to activate the overvoltage protection circuit (50). The DC link voltage (Vdc) starts dropping.

As described above, the energy regenerated in the DC link unit (30) is only the magnetic energy stored in the load (2). Thus, the loss consumed by the resistor (51) during the activation of the overvoltage protection circuit (50) is less than that in the braking circuit of WO 2017/098836.

Suppose that at time t4 after time t3, the DC link voltage (Vdc) that is dropping becomes lower than or equal to the first predetermined value and higher than the second predetermined value. Only the output signal from the comparator (74) is switched from "ON" to "OFF."

However, only the condition where the output signal from the comparator (74) has been switched to "OFF" does not cause the determination unit (76) to switch the actuating signal (G_OVDPOR). The condition where the output signal from the comparator (74) and the output signal from the comparator (75) have been both switched to "OFF" causes the determination unit (76) to switch the actuating signal (G_OVDPOR). This is because the DC link voltage (Vdc) is to be reduced as much as possible. At time t4, even if the output signal from the comparator (74) is switched to "OFF," the determination unit (76) keeps the actuating signal (G_OVDPOR) "ON" continuously from time t3. The overvoltage protection circuit (50) is active even after time t4, and the DC link voltage (Vdc) continues to drop.

Suppose that at time t5, the DC link voltage (Vdc) becomes lower than or equal to the second predetermined value. The comparator (75) switches its output signal from "ON" to "OFF." As a result, the output signals from both of the comparators (74, 75) are "OFF." This allows the determination unit (76) to switch the actuating signal (G_OVDPOR) from "ON" to "OFF." Upon receipt of the actuating signal (G_OVDPOR), the semiconductor element (52) is turned off to deactivate the overvoltage protection circuit (50). The DC link voltage (Vdc) stops dropping, and is kept at or below the second predetermined value.

This substantially prevents regeneration of the magnetic energy stored in the inductance component of the load (2) from increasing the DC link voltage (Vdc) while the inverter circuit (40) stops the switching operation. Thus, such an increase in the DC link voltage (Vdc) is substantially prevented from causing the diodes (21 to 26) of the converter circuit (20) and the switching elements (41a to 46a) of the inverter circuit (40) to be broken. The time during which the overvoltage protection circuit (50) is active, i.e., the period from time t3 to time t5, is relatively short. This causes the amount of energy consumed by the overvoltage protection circuit (50) to be also relatively small. Thus, the resistor (51) and the semiconductor element (52) both with low power tolerance can be selected.

<Single-Packaging>

As shown in FIG. 1, the inverter circuit (40) and the overvoltage protection circuit (50) are housed in the same package (P1).

The converter circuit (20), the capacitor (31), the inverter circuit (40), the overvoltage protection circuit (50), and the control circuits (60, 70) are mounted on the same substrate (80).

WO 2017/098836 cites a document intended for regenerative braking of a motor. To consume all the regenerated energy of the load (2), an element with high power tolerance needs to be selected as a constituent element of a braking circuit.

In this first embodiment, the resistor (51) with low power tolerance can be selected as described above. In addition, the time during which the overvoltage protection circuit (50) is active is relatively short. This also allows the resultant loss to be low. In this first embodiment, the resistor (51) with a small size can be selected.

In addition, the semiconductor element (52) of the overvoltage protection circuit (50) and the switching elements (41a to 46a) of the inverter circuit (40) are mainly made of a wide-bandgap semiconductor. The chip area occupied by the elements constituting the inverter circuit (40) can be relatively small. Even if the semiconductor element (52) has a size large enough to withstand a relatively high current, the chip area occupied by the elements constituting the overvoltage protection circuit (50) can be relatively small.

This makes it easier for the inverter circuit (40) and the overvoltage protection circuit (50) to be housed in the same package (P1) in this first embodiment.

The switching operation causes the switching elements (41a to 46a) to generate heat. Thus, the switching elements (41a to 46a) need to be cooled. The resistor (51) also generates heat by passing current therethrough. In this first embodiment, the inverter circuit (40) and the overvoltage protection circuit (50) are housed in the same package (P1). Thus, cooling the switching elements (41a to 46a) allows the resistor (51) to be also cooled. A mechanism for cooling the switching elements (41a to 46a) and a mechanism for cooling the resistor (51) do not have to be separately provided.

<Advantages>

In this first embodiment, the overvoltage protection circuit (50) can consume the magnetic energy stored in the inductance component of the load (2). This can reduce the capacitance of the capacitor (31).

The capacitor (31) has a capacitance that is low to the extent that it allows variation of the output voltage from the converter circuit (20), and absorbs variation of the output voltage from the inverter circuit (40) due to the switching operation. The amount of power consumed by the overvoltage protection circuit (50) is merely approximately equal to the amount of energy stored in the inductance of the load (2). Thus, the resistor (51) and the semiconductor element (52) with lower power tolerance than if the overvoltage protection circuit (50) consumes power to regeneratively brake the load (2) can be selected as the resistor (51) and the semiconductor element (52) which are included in the overvoltage protection circuit (50).

The resistor (51) and the semiconductor element (52) both with low power tolerance have a relatively small element size. As a result, the overvoltage protection circuit (50) can be easily housed in the same package (P1) together with the inverter circuit (40), and cooling the inverter circuit (40) allows the overvoltage protection circuit (50) to be also cooled at the same time. Thus, the inverter circuit (40) and the overvoltage protection circuit (50) can share a high-performance heat dissipation mechanism. This can reduce the device size and cost. In addition, since the high-performance heat dissipation mechanism cools the overvoltage protection circuit (50), the elements constituting the overvoltage protection circuit (50) can also be miniaturized. If the converter circuit (20) is also housed in the same package (P1), the device size can be further reduced.

The switching elements (41a to 46a) and the semiconductor element (52) are mainly made of a wide-bandgap semiconductor containing silicon carbide, gallium nitride, or diamond. The chip area occupied by the elements constituting each of the inverter circuit (40) and the overvoltage protection circuit (50) can be relatively small.

In addition, since the overvoltage protection circuit (50) includes the resistor (51) and the semiconductor element (52), the overvoltage protection circuit (50) can consume energy at an optional timing. This allows the period during which energy is consumed to be longer, and allows the amount of energy (i.e., power) consumed per unit time to be smaller, than if the overvoltage protection circuit (50) consists of a varistor or a Zener diode. This can further miniaturize components of the overvoltage protection circuit (50).

In addition, the overvoltage protection circuit (50) includes the resistor (51) typically having a higher heat-resistant temperature than the varistor or the Zener diode does. This allows the overvoltage protection circuit (50) to easily have a smaller size than if the overvoltage protection circuit (50) consists of the varistor or the Zener diode.

The amount of electric energy that can be retained by the capacitor (31) before the voltage of the capacitor (31) exceeds a steady operating voltage to reach the withstand voltage is smaller than the maximum amount of magnetic energy that can be stored in the load (2). The absence of the overvoltage protection circuit (50) would cause the capacitor

(31) to absorb the magnetic energy in the load (2) while the inverter circuit (40) stops its switching operation. As a result, the voltage of the capacitor (31) would exceed the withstand voltage thereof. However, in this first embodiment, the overvoltage protection circuit (50) is provided. This can reduce the amount of power absorbed by the capacitor (31), and can prevent the voltage of the capacitor (31) from exceeding the withstand voltage thereof without increasing the capacitance and withstand voltage of the capacitor (31). This can reduce the size and cost of the capacitor (31).

Second Embodiment

Figure 3:
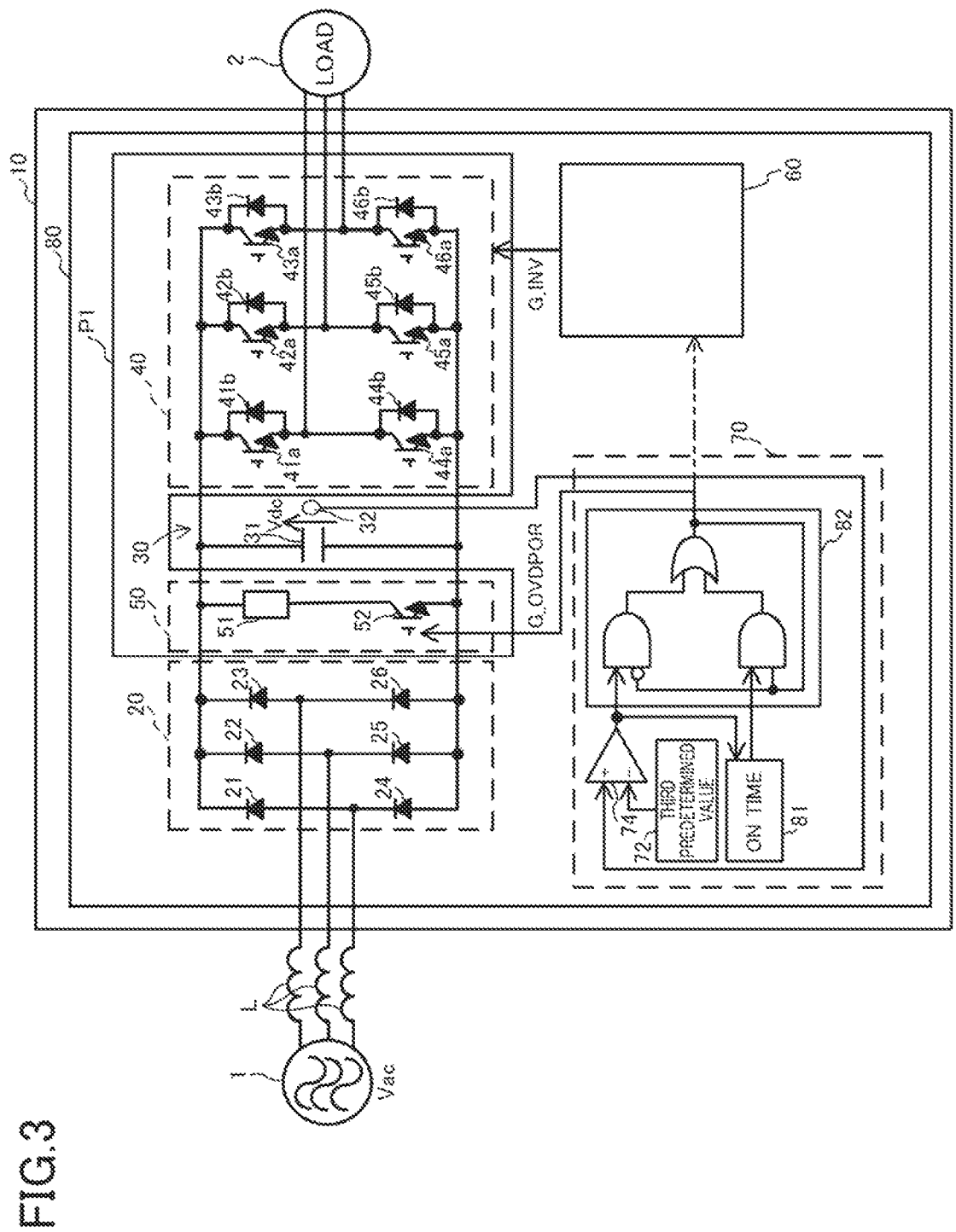
FIG. 3 is a circuit diagram of a power conversion device according to a second embodiment.

A power conversion device (10) according to this second embodiment will be described with reference to FIGS. 3 and 4.

<Configurations>

This second embodiment is different from the first embodiment in the configuration of a second control unit (70). The configuration of a power conversion device (10) shown in FIG. 3 except the second control unit (70) is the same as that shown in FIG. 1. The second control unit (70) will now be described.

—Second Control Unit—

Just like the first embodiment, one input terminal of the second control unit (70) is connected to a voltage detector (32). One output terminal of the second control unit (70) is connected to an input terminal of a semiconductor element (52) of an overvoltage protection circuit (50). The second control unit (70) controls the overvoltage protection circuit (50).

Unlike the first embodiment, the second control unit (70) includes two setteers (72, 81), one comparator (74), and one determination unit (82).

One (72) of the two setteers (72, 81) sets, and stores, a third predetermined value.

The comparator (74) compares the third predetermined value with a DC link voltage (Vdc), which is the detection result of the voltage detector (32).

The other setter (81) stores a predetermined time. To distinguish the setter (81) from the setter (72), the setter (81) is hereinafter referred to as the "ON time setter."

The ON time setter (81) has one input terminal and one output terminal. The input terminal of the ON time setter (81) is connected to an output terminal of the comparator (74). The output terminal of the ON time setter (81) is connected to an input terminal of the determination unit (82).

The ON time setter (81) determines whether or not a DC link voltage (Vdc) applied to an inverter circuit (40) is higher than or equal to the third predetermined value, based on an output signal from the comparator (74). The ON time setter (81) has set its output signal to "ON" until a predetermined time has elapsed since the DC link voltage (Vdc) higher than or equal to the third predetermined value was applied to the inverter circuit (40).

The predetermined time is previously set based on the threshold of the amount of heat generated by each of the resistor (51) and the semiconductor element (52) of the overvoltage protection circuit (50). In this second embodiment, the predetermined time is fixed.

The output signal from the comparator (74) and the output signal from the ON time setter (81) are fed to the determination unit (82). The determination unit (82) performs a logical operation on these signals. An actuating signal (G_OVDPOR) output by the determination unit (82) is applied to the semiconductor element (52). The semiconductor element (52) is turned on and off.

<Operation>

Figure 4:
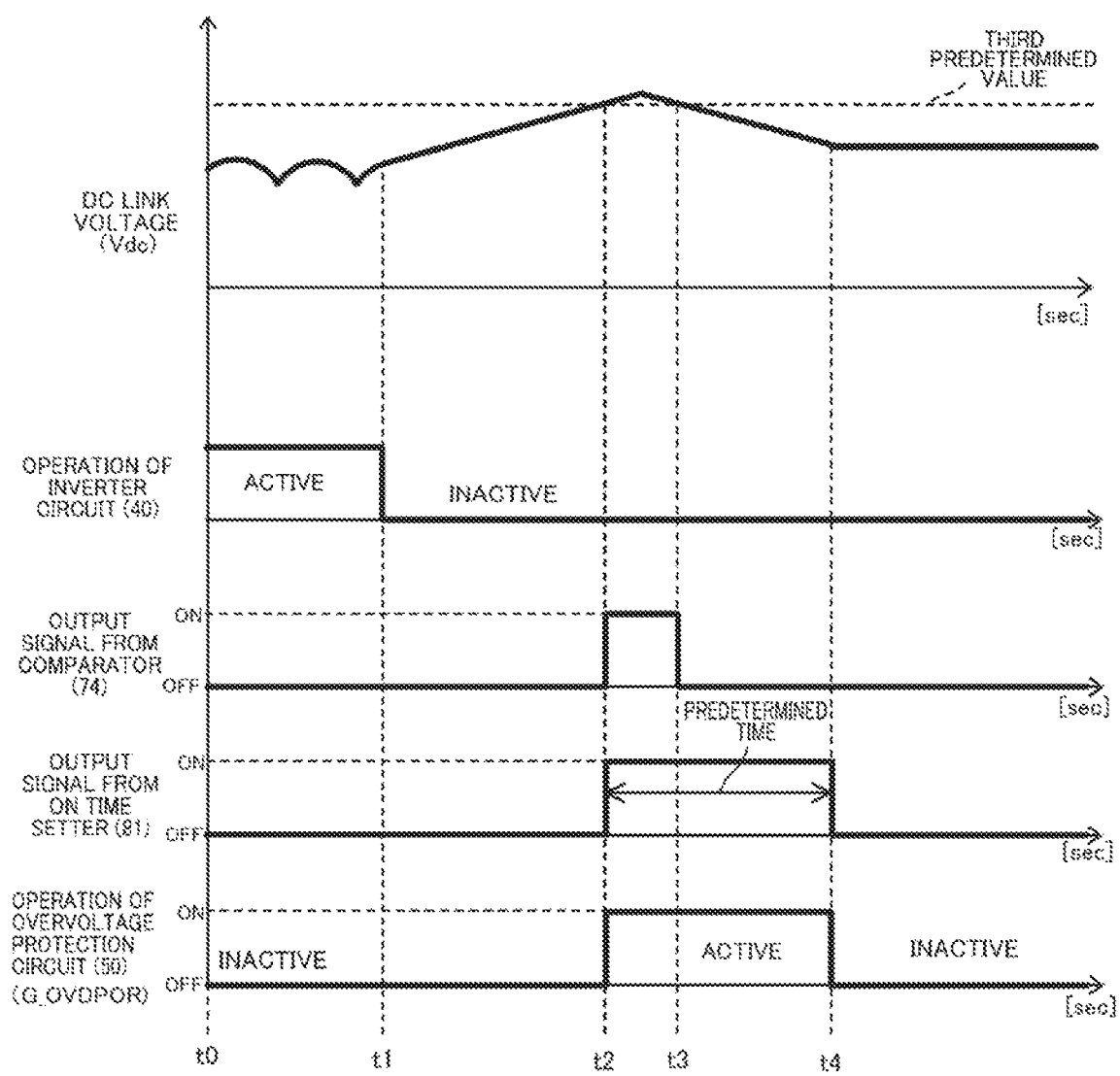
FIG. 4 is a timing chart showing how circuits operate in the second embodiment.

FIG. 4 shows changes in the DC link voltage (Vdc), the operation of the inverter circuit (40), the output signal from the comparator (74), the output signal from the ON time setter (81), and the operation of the overvoltage protection circuit (50) over time.

From time t0 to time t1, the inverter circuit (40) performs a switching operation. During this period, the DC link voltage (Vdc) is lower than the third predetermined value, and is stable. The output signal from each of the comparator (74) and the ON time setter (81) and the actuating signal (G_OVDPOR) are "OFF." This allows the overvoltage protection circuit (50) to be inactive.

Suppose that at time t1, the first control unit (60) stops the switching operation of the inverter circuit (40). Backflow of the inductance energy of the load (2) starts increasing the DC link voltage (Vdc).

Suppose that at time t2, the DC link voltage (Vdc) exceeds the third predetermined value. The comparator (74) switches its output signal from "OFF" to "ON."

Upon receipt of the output signal from the comparator (74), the ON time setter (81) switches its own output signal from "OFF" to "ON" at the same time as the time when the output signal from the comparator (74) is switched. The ON time setter (81) starts measuring the time that has elapsed since its own output signal was switched to "ON."

At time t2, the output signals fed to the determination unit (82) are all "ON." Thus, the determination unit (82) switches the actuating signal (G_OVDPOR) from "OFF" to "ON." Upon receipt of the actuating signal (G_OVDPOR), the semiconductor element (52) is turned on to activate the overvoltage protection circuit (50). The DC link voltage (Vdc) starts dropping.

Suppose that at time t3, the DC link voltage (Vdc) that is dropping becomes lower than the third predetermined value. Only the output signal from the comparator (74) is switched from "ON" to "OFF." The ON time setter (81) and the determination unit (82) keep their output signals "ON."

Suppose that at time t4, the elapsed time that has been measured by the ON time setter (81) since time t2, reaches the predetermined time. The ON time setter (81) switches its output signal from "ON" to "OFF." As a result, the output signals from the comparator (74) and the ON time setter (81) are both "OFF." This allows the determination unit (82) to switch the actuating signal (G_OVDPOR) from "ON" to "OFF." Upon receipt of the actuating signal (G_OVDPOR), the semiconductor element (52) is turned off to deactivate the overvoltage protection circuit (50). The DC link voltage (Vdc) stops dropping, and is kept at or below the third predetermined value.

This substantially prevents regeneration of the energy stored in the inductance component of the load (2) from increasing the DC link voltage (Vdc) while the inverter circuit (40) stops the switching operation. Thus, such an increase in the DC link voltage (Vdc) is substantially prevented from causing the diodes (21 to 26) of the converter circuit (20) and the switching elements (41a to 46a) of the inverter circuit (40) to be broken, just like the first embodiment. The time during which the overvoltage protection circuit (50) is active, i.e., the period from time t2, to time t4, is relatively short. This causes the amount of energy consumed by the overvoltage protection circuit (50) to be also relatively small. The resistor (51) and the semiconductor element (52) both with low power tolerance can be selected.

Just like the first embodiment, the semiconductor element (52) of the overvoltage protection circuit (50) and the switching elements (41a to 46a) of the inverter circuit (40) are mainly made of a wide-bandgap semiconductor. The chip area occupied by the elements constituting each of the inverter circuit (40) and the overvoltage protection circuit (50) can be relatively small.

This makes it easier for the inverter circuit (40) and the overvoltage protection circuit (50) to be housed in the same package (P1). Thus, cooling the switching elements (41a to 46a) allows the resistor (51) to be also cooled.

<Advantages>

Unlike the first embodiment, in this second embodiment, if the DC link voltage (Vdc) applied to the inverter circuit (40) is higher than or equal to the third predetermined value, the second control unit (70) activates the overvoltage protection circuit (50). If a predetermined time has elapsed since the activation of the overvoltage protection circuit (50), the second control unit (70) deactivates the overvoltage protection circuit (50). Activation of the overvoltage protection circuit (50) lowers the DC link voltage (Vdc). The third predetermined value and the predetermined time can determine the optimal power capacity of each of components of the overvoltage protection circuit (50). This can reduce the device size and cost.

Third Embodiment

A power conversion device (10) according to this third embodiment will be described with reference to FIGS. 5 and 6.

<Configurations>

The power conversion device (10) according to this third embodiment includes one wire (L1) connecting a first control unit (60) and a second control unit (70) together in addition to the configuration shown in FIG. 1 of the first embodiment. The first control unit (60) further has two input terminals and one output terminal in addition to the configuration shown in FIG. 1 of the first embodiment. The second control unit (70) further has one input terminal and an AND operator (78) in addition to the configuration shown in FIG. 1 of the first embodiment.

Figure 5:
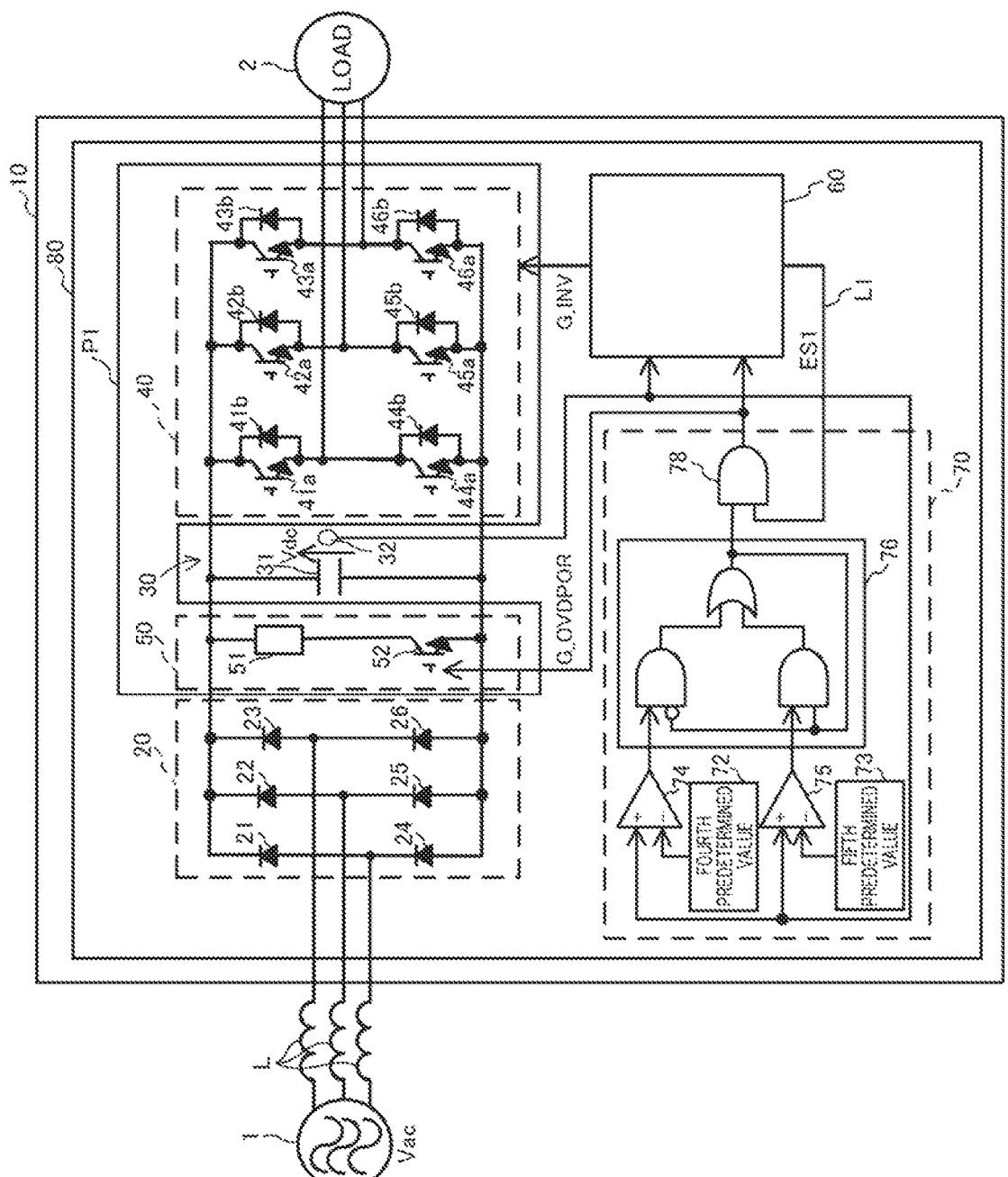
FIG. 5 is a circuit diagram of a power conversion device according to a third embodiment.

The first control unit (60) shown in FIG. 5 has the two input terminals. One of the input terminals receives an actuating signal (G_OVDPOR), which is an output from the second control unit (70). The other input terminal receives a DC link voltage (Vdc) detected by a voltage detector (32).

The first control unit (60) uses an output signal (G_OVDPOR) from the second control unit (70) and the DC link voltage (Vdc) to allow switching elements (41a to 46a) of an inverter circuit (40) that is stopping a switching operation to perform the switching operation.

The one output terminal of the first control unit (60) outputs a control signal (ES1) for turning an output from a determination unit (76) off. The one input terminal of the second control unit (70) is connected to the one output terminal of the first control unit (60) through the wire (L1) to receive the control signal (ES1). The one input terminal of the second control unit (70) is connected to the input of the AND operator (78). The AND operator (78) calculates the logical product of the control signal (ES1) and an output signal from the determination unit (76). An output signal from the AND operator (78) serves as the output signal (G_OVDPOR) from the second control unit (70).

A setter (73) of the second control unit (70) sets, and stores, a fifth predetermined value. A setter (72) sets, and stores, a fourth predetermined value. The fourth and fifth predetermined values are threshold voltages, and are used to control operation of the semiconductor element (52). The fifth predetermined value is set to be lower than the fourth predetermined value.

The first control unit (60) stores a sixth predetermined value. The sixth predetermined value is a threshold voltage, and is used to control the control signal (ES1). The sixth predetermined value is set to be lower than the fourth predetermined value and higher than the fifth predetermined value.

A comparator (74) compares the fourth predetermined value with the DC link voltage (Vdc). A comparator (75) compares the fifth predetermined value with the DC link voltage (Vdc).

Except for the foregoing features, the configurations of the power conversion device (10) of this third embodiment are the same as, or similar to, those shown in FIG. 1.

<Operation>

Figure 6:
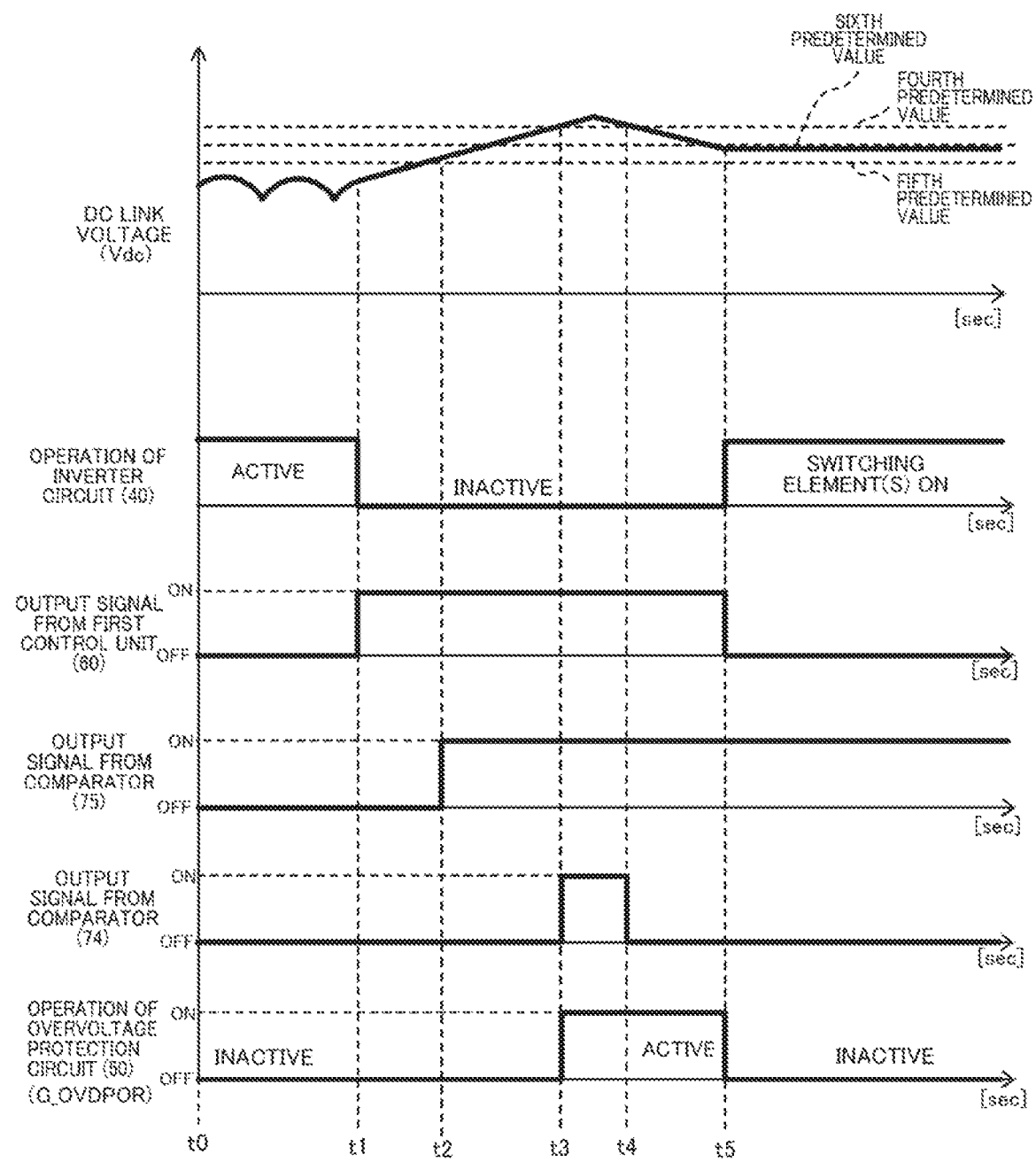
FIG. 6 is a timing chart showing how circuits operate in the third embodiment.

FIG. 6 shows changes in the DC link voltage (Vdc), the operation of the inverter circuit (40), the output signal (ES1) from the first control unit (60), the output signal from each comparator (74, 75), and the operation of the overvoltage protection circuit (50) over time.

From time t0 to time t1, the inverter circuit (40) performs the switching operation. During this period, the DC link voltage (Vdc) is lower than the fifth predetermined value, and is stable. The control signal (ES1), the output signal from each of the two comparators (74, 75), and the actuating signal (G_OVDPOR) are "OFF." This allows the overvoltage protection circuit (50) to be inactive.

Suppose that at time t1, the first control unit (60) stops the switching operation of the inverter circuit (40). At this time, the control signal (ES1) from the first control unit (60) is switched from "OFF" to "ON." The control signal (ES1) indicates the stop of the switching operation. From time 1, regeneration of energy stored in an inductance component of a load (2) starts increasing the DC link voltage (Vdc).

Suppose that at time t2, the DC link voltage (Vdc) exceeds the fifth predetermined value. The comparator (75) switches its output signal from "OFF" to "ON."

Suppose that as a result of a further continuous increase in the DC link voltage (Vdc), the DC link voltage (Vdc) becomes higher than or equal to the fourth predetermined value at time t3. The comparator (74) switches its output signal from "OFF" to "ON."

At time t3, the output signals fed from the comparators (74, 75) to the determination unit (76) are all "ON." The determination unit (76) switches its output signal from "OFF" to "ON." At this time, input signals to the AND operator (78) are all turned "ON." The AND operator (78) switches the actuating signal (G_OVDPOR) from "OFF" to "ON." Upon receipt of the actuating signal (G_OVDPOR), the semiconductor element (52) is turned on to activate the overvoltage protection circuit (50). The DC link voltage (Vdc) starts dropping.

Suppose that at time t4 after time t3, the DC link voltage (Vdc) that is dropping becomes lower than or equal to the fourth predetermined value and higher than the fifth predetermined value. Only the output signal from the comparator (74) is switched from "ON" to "OFF." However, the output signal from the determination unit (76) continues to be "ON" from time t3, and the actuating signal (G_OVDPOR) is also kept "ON." This is because the DC link voltage (Vdc) is to be reduced as much as possible. The overvoltage protection circuit (50) is active even after time t4, and the DC link voltage (Vdc) continues to drop.

Suppose that at time t5, the DC link voltage (Vdc) becomes lower than or equal to the sixth predetermined value. In response to the DC link voltage (Vdc) lower than or equal to the sixth predetermined value and the actuating signal (G_OVDPOR) in the "ON" state, the first control unit (60) outputs control signals (G_INV) to the inverter circuit (40). The control signals (G_INV) are intended to turn (switch) on at least one of the switching elements (41a to 46a) of the inverter circuit (40) that is stopping the switching operation. The first control unit (60) switches the control signal (ES1) from "ON" to "OFF" after turning the at least one of the switching elements (41a to 46a) on.

The control signal (ES1) switched to "OFF" causes the AND operator (78) to switch its output signal to "OFF." Thus, the actuating signal (G_OVDPOR) is switched from "ON" to "OFF."

The semiconductor element (52) of the overvoltage protection circuit (50) is turned off to deactivate the overvoltage protection circuit (50). The DC link voltage (Vdc) is kept at or below the sixth predetermined value.

In this third embodiment, the first control unit (60) generates the control signal (ES1) indicating the state of the switching operation of the switching elements (41a to 46a). However, a circuit that generates a similar signal using the control signal (G_INV) may be separately provided. For example, the logical sum of driving signals for all of the switching elements (41a to 46a) is calculated, and inverting the calculated logical sum can provide the same signal as the control signal (ES1).

Regeneration of the energy stored in the inductance component of the load (2) is substantially prevented from increasing the DC link voltage (Vdc) while the inverter circuit (40) stops the switching operation. Thus, such an increase in the DC link voltage (Vdc) is substantially prevented from causing the diodes (21 to 26) of the converter circuit (20) and the switching elements (41a to 46a) of the inverter circuit (40) to be broken, just like the first and second embodiments. The time during which the overvoltage protection circuit (50) is active, i.e., the period from time t3 to time t5, is relatively short. This causes the amount of energy consumed by the overvoltage protection circuit (50) to be also relatively small.

Furthermore, in this third embodiment, the first and second control units (60) and (70) deactivate the overvoltage protection circuit (50) after turning (switching) at least one of the switching elements (41a to 46a) on. This reduces the load on the overvoltage protection circuit (50). The resistor (51) and the semiconductor element (52) both with lower power tolerance can be selected. This can further reduce heat generated by the resistor (51).

Suppose that the switching elements (41a to 46a) are turned on after the deactivation of the overvoltage protection circuit (50). If the DC link voltage (Vdc) is higher than or equal to the voltage tolerance of the switching elements (41a to 46a) when the switching elements (41a to 46a) are turned on, the switching elements (41a to 46a) may be broken. To address this problem, in this third embodiment, at least one of the switching elements (41a to 46a) is turned on before the deactivation of the overvoltage protection circuit (50). Thereafter, the overvoltage protection circuit (50) is deactivated. This can substantially prevent the switching elements (41a to 46a) from being broken.

Just like the first and second embodiments, the semiconductor element (52) of the overvoltage protection circuit (50) and the switching elements (41a to 46a) of the inverter circuit (40) are mainly made of a wide-bandgap semiconductor. The chip area occupied by the elements constituting each of the inverter circuit (40) and the overvoltage protection circuit (50) can be relatively small.

This makes it easier for the inverter circuit (40) and the overvoltage protection circuit (50) to be housed in the same package (P1). Thus, cooling the switching elements (41a to 46a) allows the resistor (51) to be also cooled.

<Advantages>

Unlike the first and second embodiments, in this third embodiment, if the DC link voltage (Vdc) applied to the inverter circuit (40) that is stopping the switching operation is higher than or equal to the fourth predetermined value, the second control unit (70) activates the overvoltage protection circuit (50). Activation of the overvoltage protection circuit (50) lowers the DC link voltage (Vdc). The first control unit (60) turns (switches) on at least one of the switching elements (41a to 46a) of the inverter circuit (40) that is stopping the switching operation after the activation of the overvoltage protection circuit (50). This reduces the load on the overvoltage protection circuit (50). Thus, the resistor (51) and the semiconductor element (52) both with lower power tolerance can be selected.

Furthermore, the second control unit (70) deactivates the overvoltage protection circuit (50) after turning (switching) at least one of the switching elements (41a to 46a) on. This can substantially prevent the switching elements (41a to 46a) from being broken.

Fourth Embodiment

Figure 7:
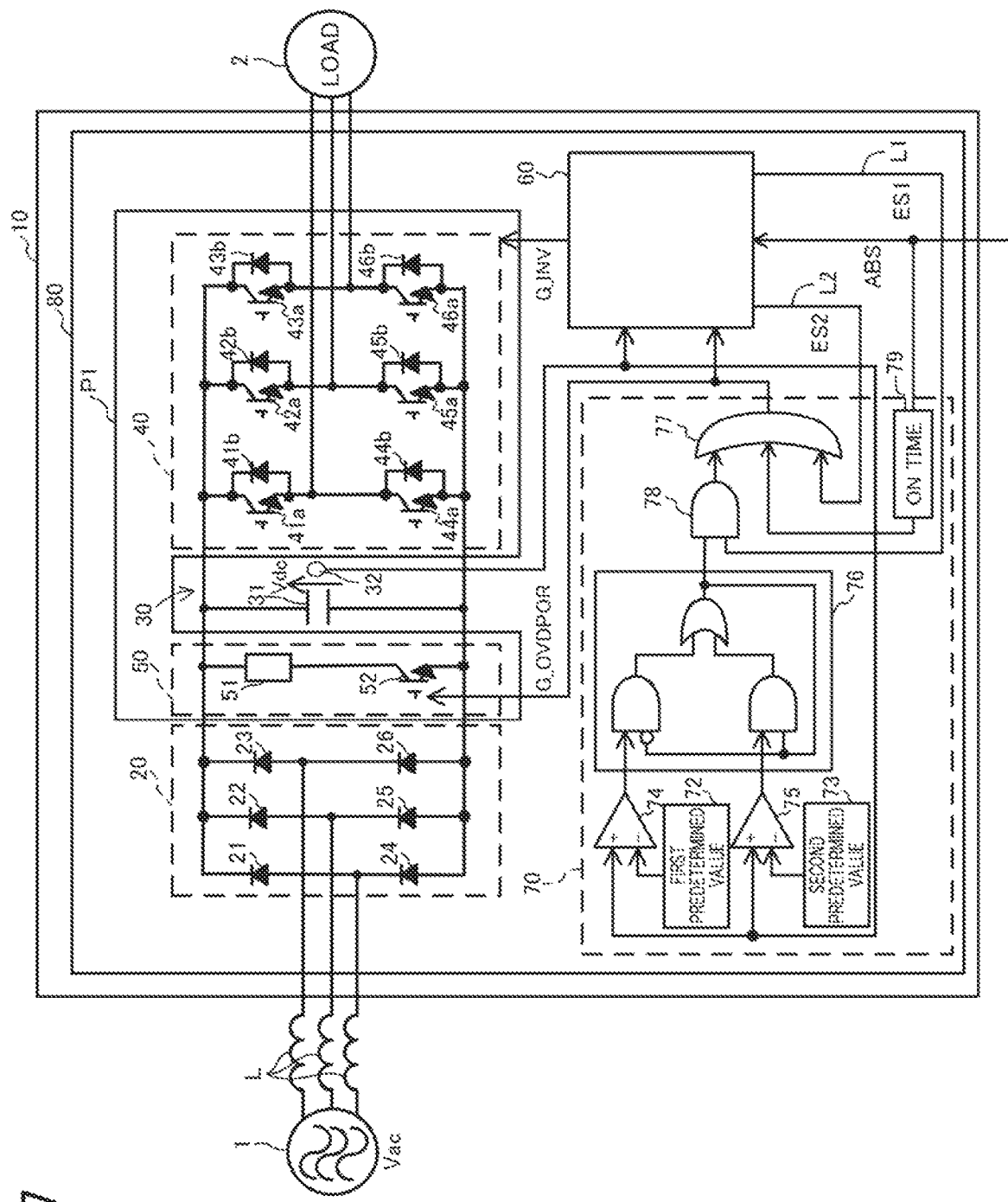
FIG. 7 is a circuit diagram of a power conversion device according to a fourth embodiment.

A power conversion device (10) according to this fourth embodiment will be described with reference to FIG. 7.

<Configurations>

In this fourth embodiment, in addition to the configuration of the third embodiment, one input terminal and one output terminal for a first control unit (60), two input terminals, one ON time setter (79), and one OR circuit (77) for a second control unit (70), and one wire (L2) connecting the first and second control units (60) and (70) together are further provided.

The first control unit (60) has the input terminal that receives an abnormal stop signal (ABS) indicating whether or not an abnormal situation has occurred in a load (2), in addition to the configuration of the third embodiment. This input terminal is connected to a wire to receive the abnormal stop signal (ABS) from an external controller (not shown). If, during a switching operation, a transition is made from the state where the abnormal stop signal (ABS) indicates that no abnormal situation has occurred to the state where the abnormal stop signal (ABS) indicates that an abnormal situation has occurred, the first control unit (60) stops the switching operation for switching elements (41a to 46a) at the same time to stop supplying AC power to the load (2). Examples of the abnormal situation in the load (2) include a situation where an overcurrent flows through the load (2) serving as a motor.

The first control unit (60) has the output terminal that outputs a control signal (ES2) for turning an output signal (G_OVDPOR) from the second control unit (70) on and off, in addition to the configuration of the third embodiment. The first control unit (60) recognizes whether or not the charging period during which the capacitor (31) is charged is in progress, immediately after a sudden rise in the voltage of the AC power source (1) input to the power conversion device (10). The first control unit (60) can recognize whether or not the charging period is in progress, based on the DC link voltage (Vdc) detected by the voltage detector (32). When the first control unit (60) recognizes that the charging period is in progress, the control signal (ES2) is selectively turned "ON" or "OFF" based on seventh and eighth predetermined values. The seventh and eighth predetermined values are values to be compared with the DC link voltage (Vdc), and are stored in the first control unit (60). The seventh predetermined value is approximately the peak value of the voltage of the AC power source (1) under normal conditions. The eighth predetermined value is higher than the seventh predetermined value.

Examples of a situation where the voltage of the AC power source (1) input to the power conversion device (10) suddenly rises include turning-on of power to the power conversion device (10), recovery of the AC power source (1) from a momentary interruption of power, and recovery of the AC power source (1) from a momentary voltage drop. In this fourth embodiment, the case of the turning-on of the power will be exemplified.

The second control unit (70) has the input terminal that receives the control signal (ES2), in addition to the configuration of the third embodiment. This input terminal is connected through the wire (L2) to the output terminal of the first control unit (60) outputting the control signal (ES2). Since the control signal (ES2) is input to the OR circuit (77), a sudden rise in the voltage of the AC power source causes the overvoltage protection circuit (50) to active.

The second control unit (70) further has the input terminal that receives the abnormal stop signal (ABS) indicating whether or not an abnormal situation has occurred in the load (2). This input terminal is connected to a wire to receive the abnormal stop signal (ABS). The abnormal stop signal (ABS) is input to the ON time setter (79), and an output signal from the ON time setter (79) is input to the OR circuit (77). This causes the overvoltage protection circuit (50) to activate when the switching operation is irregularly stopped.

The OR circuit (77) outputs the logical sum of an output signal from an AND operator (78), the control signal (ES2) from the first control unit (60), and the output signal from the ON time setter (79).

<Operation>

Figure 8:
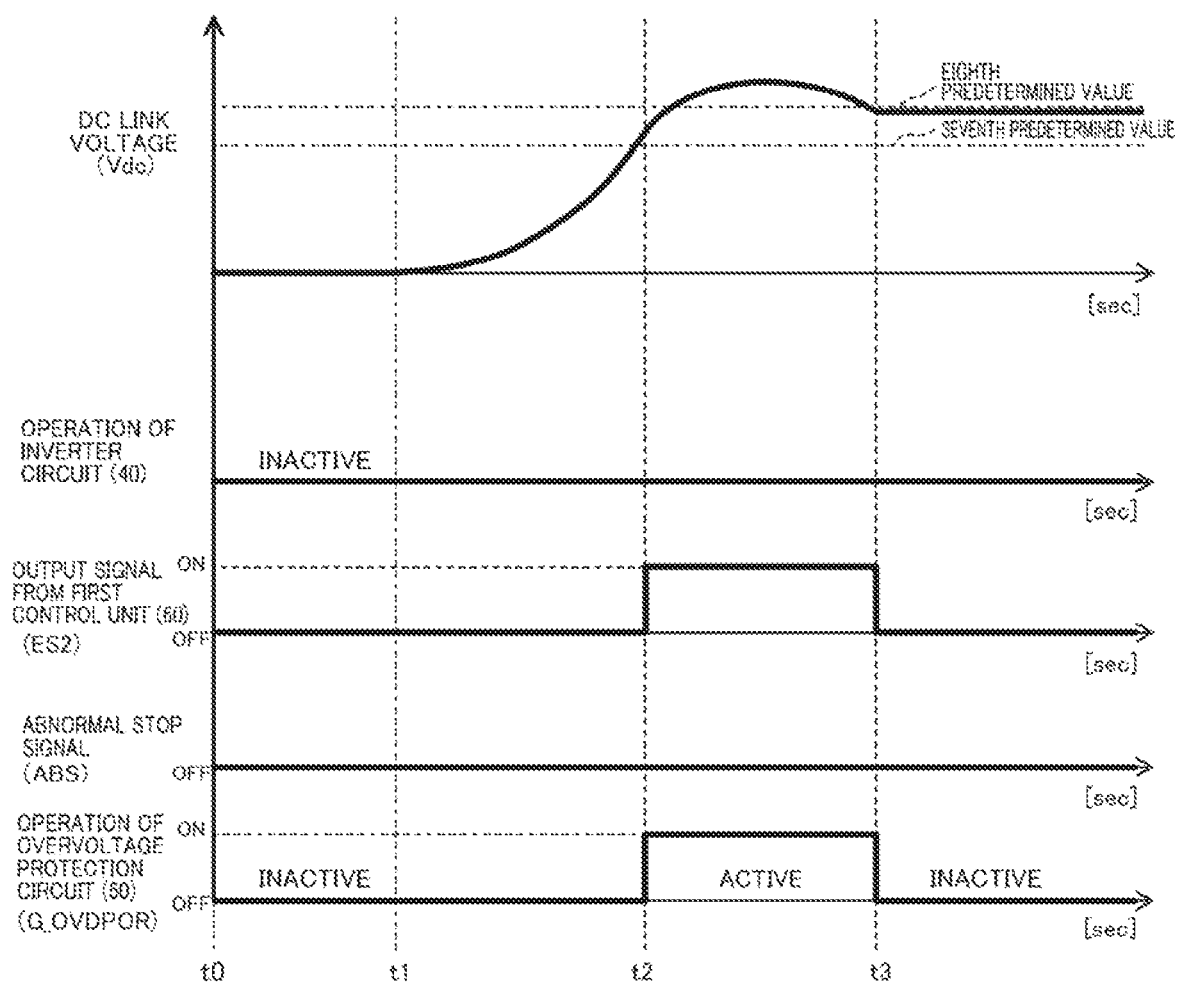
FIG. 8 is a timing chart showing how circuits operate before and after power-on in the fourth embodiment.

FIG. 8 shows changes in the DC link voltage (Vdc), the operation of the inverter circuit (40), the control signal (ES2), the abnormal stop signal (ABS), and the operation of the overvoltage protection circuit (50) over time before and after the turning-on of the AC power source (1).

From time t0 to time t1, the power conversion device (10) does not receive AC electric power from the AC power source (1). During this period, the inverter circuit (40) stops a switching operation.

At time t1, input of AC electric power from the AC power source (1) to the power conversion device (10) is started. Thus, from time t1 to time t2, i.e., from immediately after the start of the input of AC electric power from the AC power source (1), the capacitor (31) is charged, leading to a rise in the DC link voltage (Vdc).

Suppose that at time t2, the DC link voltage (Vdc) exceeds the seventh predetermined value. The first control unit (60) switches the control signal (ES2) from "OFF" to "ON." The control signal (ES2) turned "ON" allows the actuating signal (G_OVDPOR) for the overvoltage protection circuit (50) to be turned "ON." Thus, the semiconductor element (52) is turned on to activate the overvoltage protection circuit (50).

The semiconductor element (52) turned on allows some of charges accumulated in the capacitor (31) to flow through the resistor (51) and the semiconductor element (52). This allows the DC link voltage (Vdc) to more gently rise. After a while, the DC link voltage (Vdc) starts dropping, and becomes lower than or equal to the eighth predetermined value at time t3.

At time t3, the first control unit (60) switches the control signal (ES2) from "ON" to "OFF." The control signal (ES2) turned "OFF" allows the actuating signal (G_OVDPOR) for the overvoltage protection circuit (50) to be turned "OFF." Thus, the semiconductor element (52) is turned off to deactivate the overvoltage protection circuit (50). As can be seen from the foregoing description, the overvoltage protection circuit (50) is activated during a portion of the charging period immediately after the DC link voltage (Vdc) becomes higher than or equal to the seventh predetermined value.

Figure 9:
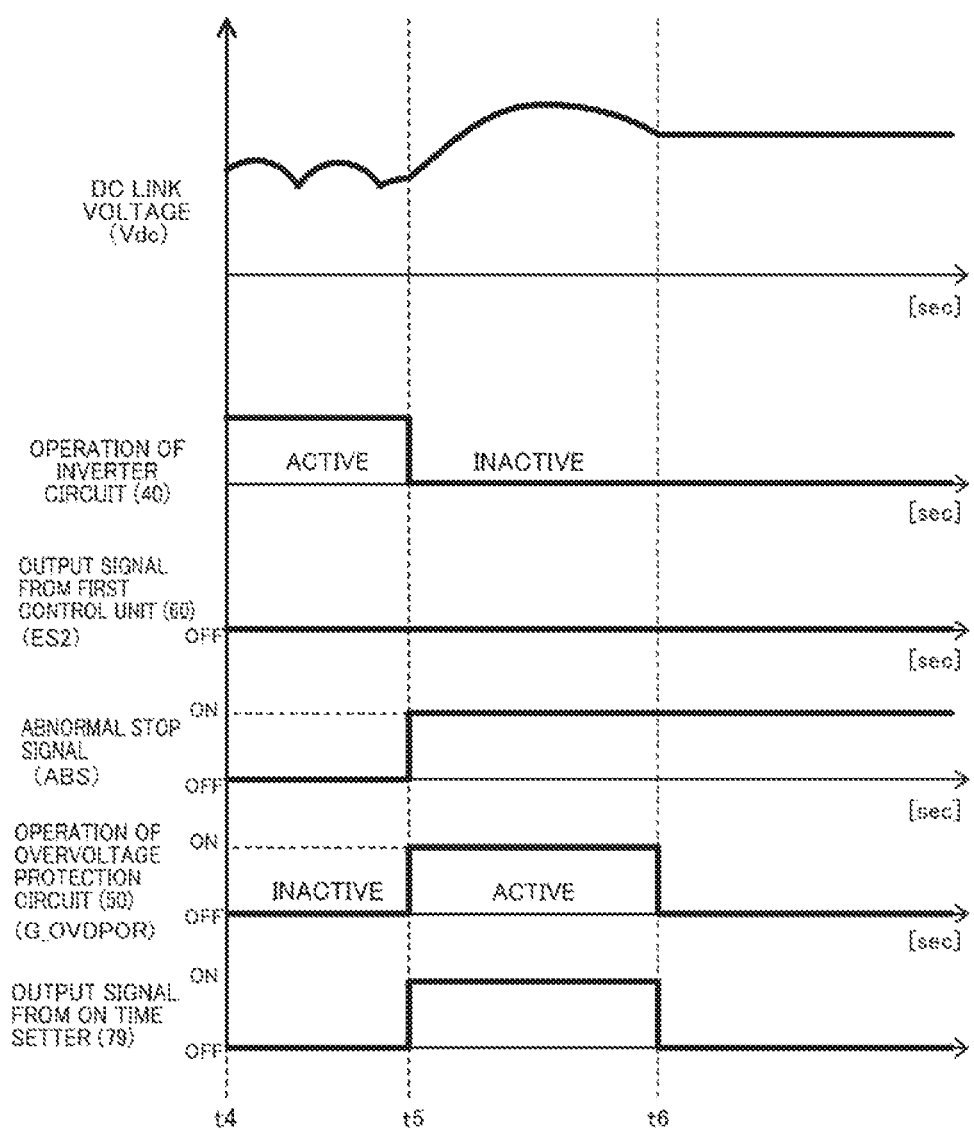
FIG. 9 is a timing chart showing how circuits operate before and after the occurrence of an abnormal situation in a load in the fourth embodiment.

FIG. 9 shows changes in the DC link voltage (Vdc), the operation of the inverter circuit (40), the control signal (ES2), the abnormal stop signal (ABS), the operation of the overvoltage protection circuit (50), and the output signal from the ON time setter (79) over time before and after the occurrence of an abnormal situation in the load (2).

From time t4 to time t5, the inverter circuit (40) performs the switching operation.

At time t5, an abnormal situation, such as a situation where an overcurrent flows through the load (2), occurs. Thus, a transition is made from the state where the abnormal stop signal (ABS) indicates that no abnormal situation has occurred to the state where the abnormal stop signal (ABS) indicates that the abnormal situation has occurred. This allows the ON time setter (79) to switch its output signal from "OFF" to "ON." The output signal from the ON time setter (79) turned "ON" allows the actuating signal (G_OVDPOR) for the overvoltage protection circuit (50) to be turned "ON." Thus, the semiconductor element (52) is turned on to activate the overvoltage protection circuit (50).

The semiconductor element (52) turned on allows current that has flowed through the load (2) to partially flow through the resistor (51) and the semiconductor element (52). This allows the DC link voltage (Vdc) to more gently rise. After a while, the DC link voltage (Vdc) starts dropping.

At time t6 when the time set by the ON time setter (79) has elapsed, the ON time setter (79) switches its output signal from "ON" to "OFF." The output signal from the ON time setter (79) turned "OFF" allows the actuating signal (G_OVDPOR) for the overvoltage protection circuit (50) to be turned "OFF." Thus, the semiconductor element (52) is turned off to deactivate the overvoltage protection circuit (50).

While the switching operation is stopped under normal conditions without depending on the abnormal stop signal (ABS), the overvoltage protection circuit (50) operates according to the DC link voltage (Vdc) as described in the first embodiment. When the switching operation is stopped under normal conditions, the first control unit (60) may turn the control signal (ES2) "ON" for a predetermined time to activate the overvoltage protection circuit (50).

<Advantages>

According to this fourth embodiment, when the DC link voltage (Vdc) becomes higher than or equal to the seventh predetermined value in the course of charging of the capacitor (31), the overvoltage protection circuit (50) is activated. Thus, the voltage of the capacitor (31) can be prevented from being much higher than the seventh predetermined value due to resonance of a resonance circuit that includes an inductance component L of a charge path and the capacitor (31). If the overvoltage protection circuit (50) is not activated, resonance of the resonance circuit that includes the inductance component L of the charge path and the capacitor (31) increases the voltage of the capacitor (31) to twice the peak value of the voltage of the AC power source (1). However, setting the seventh predetermined value to the peak value of the voltage of the AC power source (1) allows some of components flowing through the inductance component L of the charge path in the course of charging of the capacitor (31) to flow through the overvoltage protection circuit (50). This can reduce the degree to which the voltage of the capacitor (31) rises. This can lower the withstand voltage of the capacitor (31), and reduce the size and cost of the capacitor (31).

In addition, when the switching operation for the switching elements (41a to 46a) is stopped due to an abnormal situation in the load (2), the overvoltage protection circuit (50) is activated to allow the resistor to consume the inductance energy that has been stored in the load (2). Thus, the degree to which the voltage of the capacitor (31) rises can be reduced accordingly. This can lower the withstand voltage of the capacitor (31), and reduce the size and cost of the capacitor (31).

In this fourth embodiment, the first control unit (60) stops the switching operation for the switching elements (41a to 46a) to stop the supply of AC power to the load (2) during the charging period and during the occurrence of an abnormal situation in the load (2). However, only the switching operation for all of the upper-arm switching elements (44b to 46b) may be stopped. Alternatively, only the switching operation for all of the lower-arm switching elements (44a to 46a) may be stopped.

Fifth Embodiment

A power conversion device (10) according to this fifth embodiment will be described with reference to FIG. 10.
<Configurations>
In this fifth embodiment, a converter circuit (20) includes a current detector (27) that detects an output current from the converter circuit (20), in addition to the configuration of the fourth embodiment.

Figure 10:
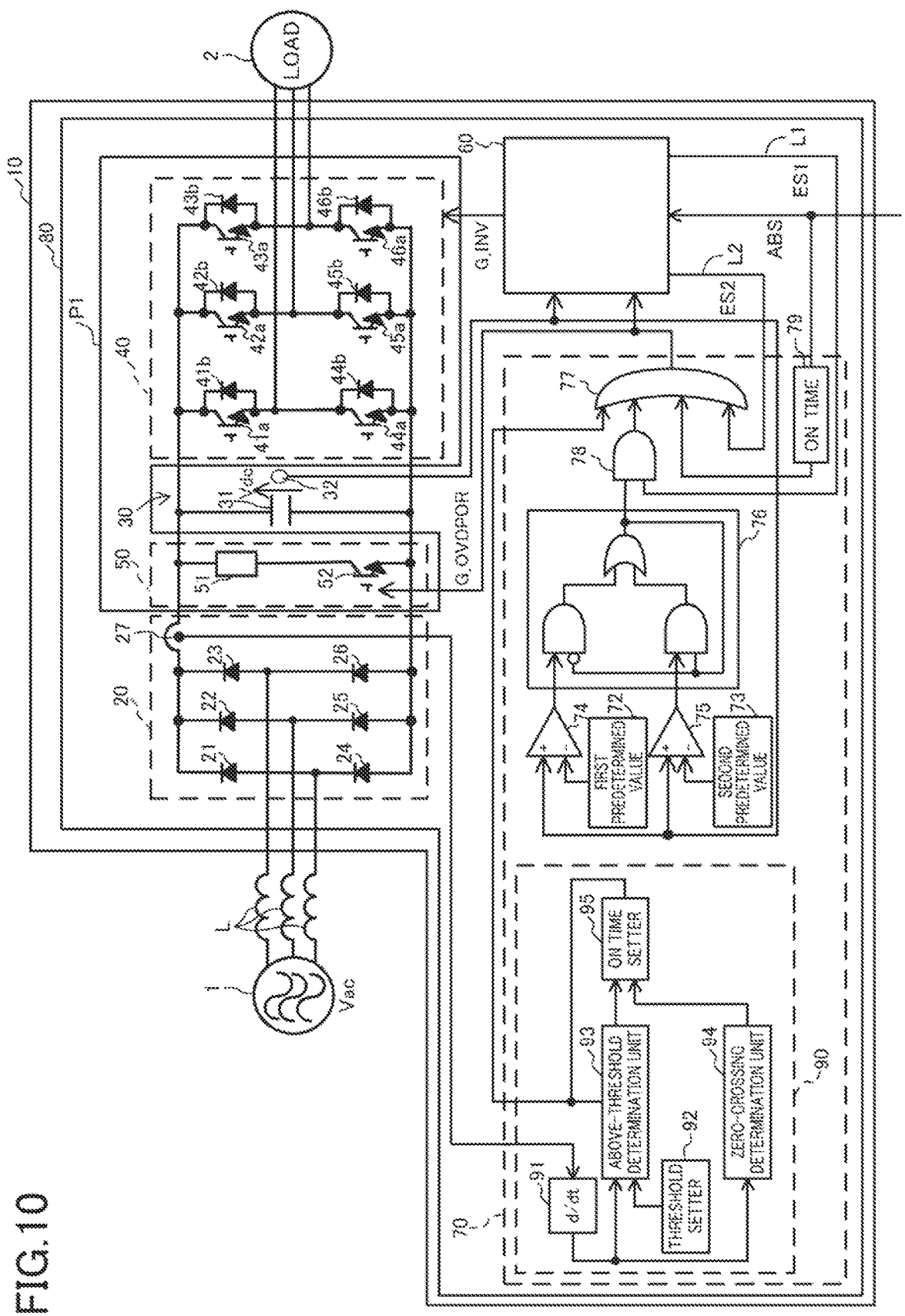
FIG. 10 is a circuit diagram of a power conversion device according to a fifth embodiment.

A second control unit (70) includes a resonance estimation circuit (90) shown in FIG. 10, in addition to the configuration of the fourth embodiment. The resonance estimation circuit (90) includes a differentiator circuit (91), a threshold setter (92), an above-threshold determination unit (93), a zero-crossing determination unit (94), and an ON time setter (95).

The differentiator circuit (91) outputs a waveform obtained by differentiating the current detected by the current detector (27).

The threshold setter (92) sets, and stores, a predetermined threshold of the differential value of the current.

If the output waveform from the differentiator circuit (91) exceeds the threshold set by the threshold setter (92), the above-threshold determination unit (93) outputs a "high"-level as an above-threshold signal.

The zero-crossing determination unit (94) determines whether or not the output waveform from the differentiator circuit (91) has reached zero.

If the result of determination made by the zero-crossing determination unit (94) shows that the output waveform from the differentiator circuit (91) has reached zero with the above-threshold signal at "high" level, the ON time setter (95) sets its output to "high" level, starts measuring the time elapsed, and switches the above-threshold signal to "low" level. If the measured time reaches the ON time, the ON time setter (95) sets the output to "low" level.

Figure 11:
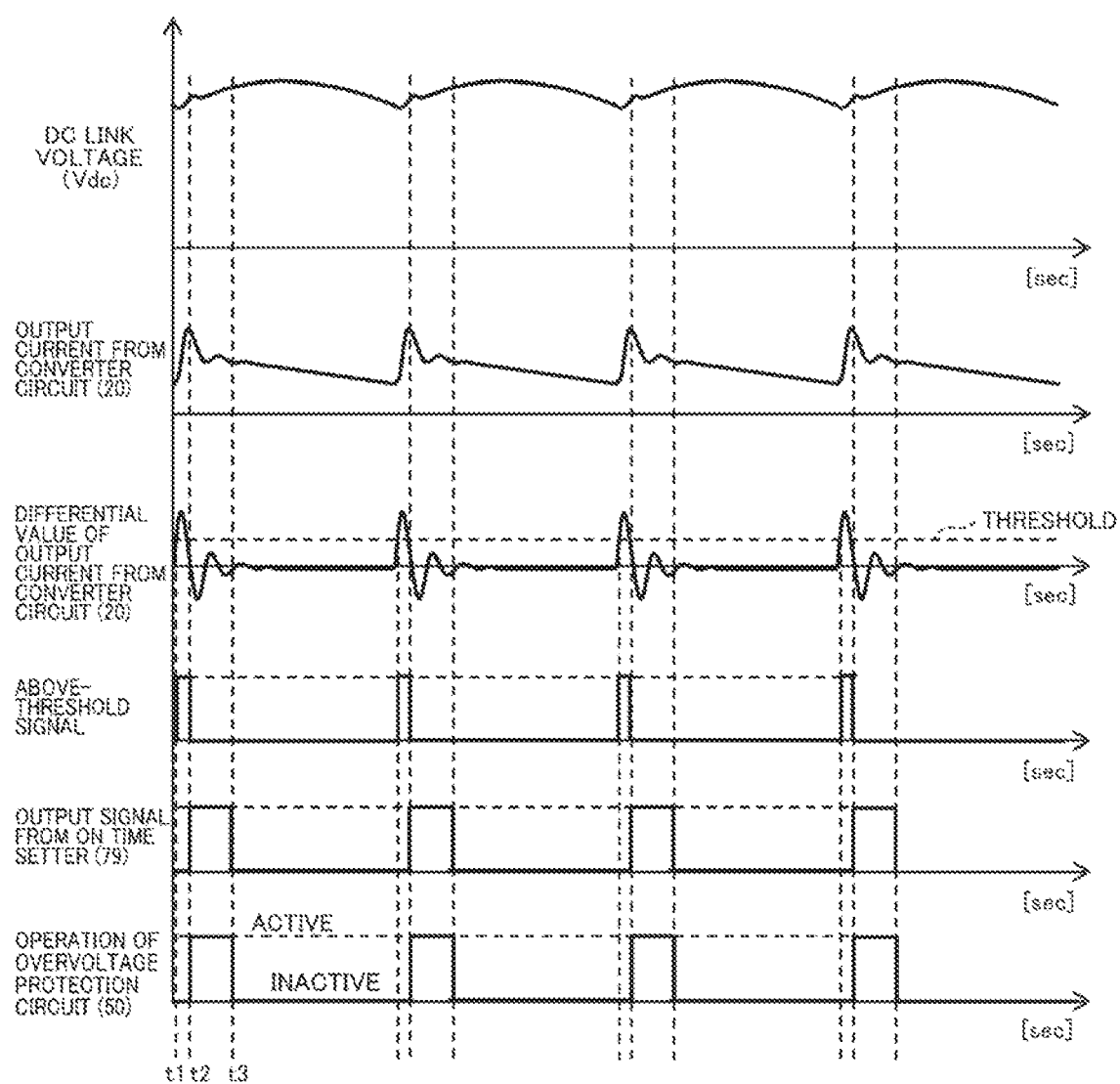
FIG. 11 is a timing chart showing how circuits operate in the fifth embodiment.

The OR circuit (77) outputs the logical sum of an output signal from an AND operator (78), an output signal from the ON time setter (79), an abnormal stop signal (ABS), a control signal (ES2), and the output signal from the ON time setter (95).
<Operation>
Operations of circuits included in the power conversion device (10) will be described with reference to the timing chart of FIG. 11. FIG. 11 shows changes in the DC link voltage (Vdc), the output current from the converter circuit (20), the differential value of the output current from the converter circuit (20), an above-threshold signal, the output signal from the ON time setter (95), and the operation of the overvoltage protection circuit (50) over time.

At time t1, the waveform of the differential value of the output current from the converter circuit (20) exceeds the threshold, and the above-threshold signal turns to "high" level.

Next, at time t2, the waveform of the differential value of the output current from the converter circuit (20) reaches zero, and the ON time setter (95) sets its output signal to "high" level, and starts measuring the time elapsed. Further, the above-threshold signal is set to "low" level.

At time t3 when the ON time has elapsed since time t2, the ON time setter (95) sets its output signal to "low" level.

The overvoltage protection circuit (50) is activated from time t2, to time t3, i.e., while the output signal from the ON time setter (95) is at "high" level.
<Advantages>
In this fifth embodiment, the overvoltage protection circuit (50) is activated during a portion of the period during which resonance occurs in a resonance circuit including an inductance component L of a charge path and a capacitor (31). Some of components flowing through the inductance component L are passed through the overvoltage protection circuit (50). This can reduce the degree to which the voltage of the capacitor (31) rises.

During the period during which the overvoltage protection circuit (50) is active, i.e., while the actuating signal (G_OVDPOR) is "ON," a semiconductor element (52) may be repeatedly and periodically turned on and off with a predetermined duty ratio. Reducing the duty ratio can increase the substantial resistance of the overvoltage protection circuit (50), and allows an appropriate amount of current to flow through the overvoltage protection circuit (50) in accordance with resonance.

Sixth Embodiment

<Configurations>
In this sixth embodiment, a first control unit (60) receives an actuating signal (G_OVDPOR) output from a second control unit (70) as indicated by the chain double-dashed arrow in FIG. 1. While the actuating signal (G_OVDPOR) is "ON," the first control unit (60) performs turn-on control to turn one or two of switching elements (41a to 46a) on so that three-phase output nodes of an inverter circuit (40) are connected to a common electrode of the capacitor (31). The one or two of the switching elements (41a to 46a) to be turned on here are of two of the three phases that allow an output current from the inverter circuit (40) to flow in the same direction or of the other one thereof that allows an output current from the inverter circuit (40) to flow in a different direction from that of the two of the three phases. The switching period during the turn-on control is set to be equal to the switching period during supply of power to the load (2).

<Operation>

Figure 12:
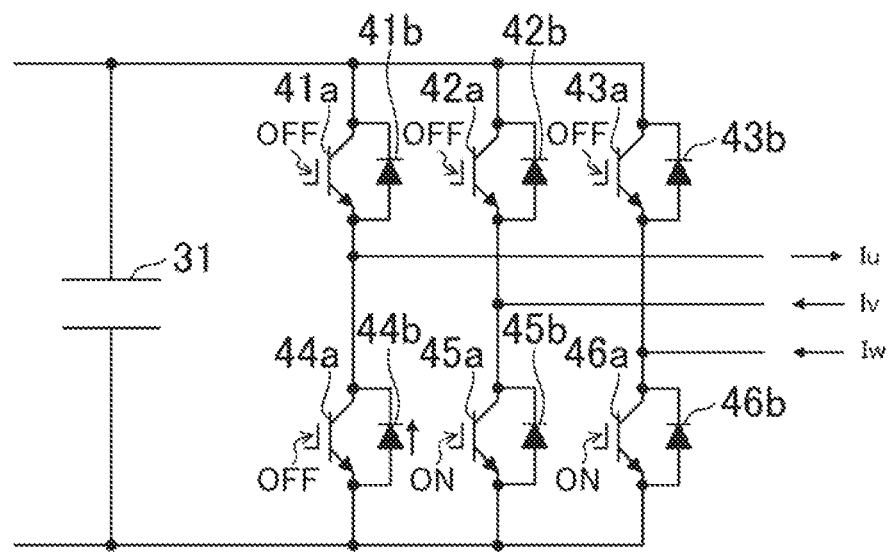
FIG. 12 is a circuit diagram illustrating a state of an inverter circuit under turn-on control according to a sixth embodiment.

For example, if, at time t3 shown in the timing chart of FIG. 2, the actuating signal (G_OVDPOR) switches from "OFF" to "ON," the first control unit (60) performs the turn-on control to turn one or two of the switching elements (41a to 46a) on so that the three-phase output nodes of the inverter circuit (40) are connected to the common electrode of the capacitor (31). For example, as shown in FIG. 12, if, among output currents from the inverter circuit (40), the U-phase current Iu is positive, and the V-phase current Iv and the W-phase current Iw are negative, turning the lower-arm switching elements (45a, 46a) of the V- and W-phases on allows all of the three-phase output nodes of the inverter circuit (40) to be at the same potential as that of the negative electrode of the capacitor (31). This allows the voltage between each pair of the output nodes of the inverter circuit (40) to be substantially zero. Thus, the output power from the inverter circuit (40) becomes substantially zero, and the average output power from the inverter circuit (40) during the turn-on control also becomes substantially zero. A situation where "the voltage between each pair of the output nodes of the inverter circuit (40) is substantially zero" herein includes a situation where an error corresponding to a voltage drop across the freewheeling diodes (41b to 46b) and the switching elements (41a to 46a) is created between the voltage between each pair of the output nodes of the inverter circuit (40) and zero. A situation where "the output power from the inverter circuit (40) is substantially zero" herein includes a situation where an error arising from power consumption of resistance components of the freewheeling diodes (41b to 46b), the switching elements (41a to 46a), and the load (2) and iron loss of the load (2) is created between the output power from the inverter circuit (40) and zero.

The other configuration and operation of this embodiment are the same as, or similar to, those of the first embodiment. Thus, the detailed description thereof will be omitted.

<Advantages>

Thus, in this sixth embodiment, the power output by the inverter circuit (40) during operation of the overvoltage protection circuit (50) is substantially zero. This allows the amount of electric energy transferred from the load (2) to the capacitor (31) to be substantially zero, thus reducing the capacitance of the capacitor (31).

Seventh Embodiment

<Vectors of Inverter Circuit>

Figure 13:
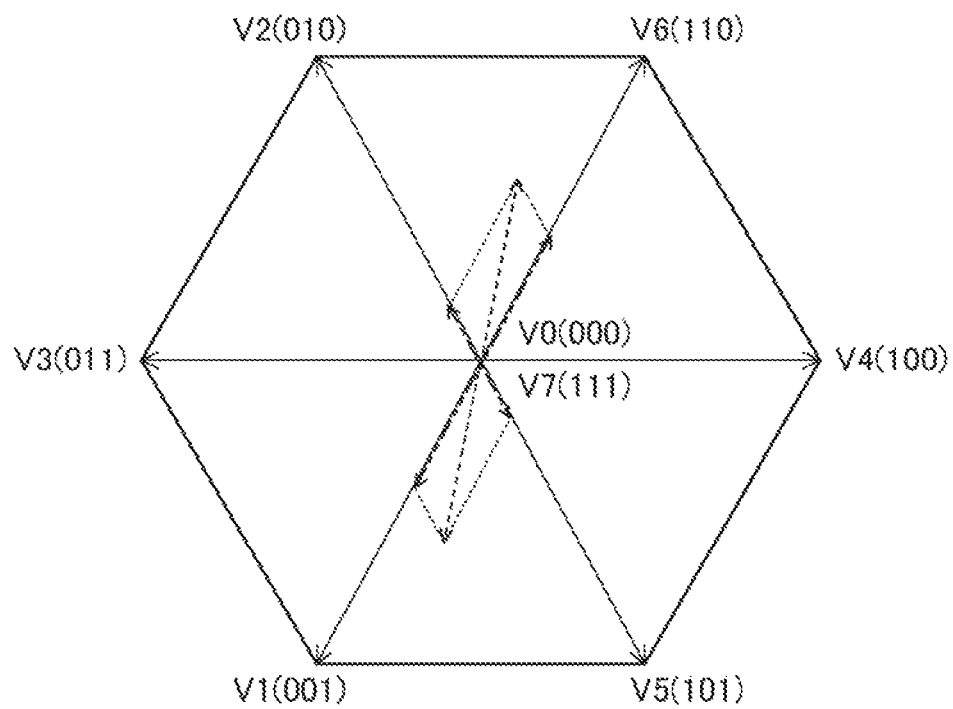
FIG. 13 is an explanatory diagram illustrating eight vectors of an inverter circuit.

As shown in FIG. 13, a two-level three-phase voltage source inverter may have eight vectors V0 to V7. In FIG. 13, figures in parentheses represent the states of connection between a capacitor (31) (a DC link unit (30)) and output nodes of U-, V-, and W-phases in this order from the left, where "1" represents the state where the associated output node is connected to the positive electrode of the capacitor (31), and "0" represents the state where the associated output node is connected to the negative electrode of the capacitor (31). In other words, "1" indicates that an associated one of upper-arm switching elements (41a to 43a) is on and an associated one of lower-arm switching elements (44a to 46a) is off, and "0" indicates that an associated one of the upper-arm switching elements (41a to 43a) is off and an associated one of the lower-arm switching elements (44a to 46a) is on. The vectors V1 to V6 are referred to as "fundamental vectors." The vector magnitudes vary depending on the proportion of the period during which the vector appears within a carrier period. If the associated switching elements output power for ½ of the carrier period, the magnitude of the associated vector is reduced by one-half. The vector V0 indicates the state where the lower-arm switching elements (44a to 46a) are all on, and the vector V7 indicates the state where the upper-arm switching elements (41a to 43a) are all on. In each of these cases, an output voltage from an inverter circuit (40) is zero. Thus, these vectors are referred to as "zero vectors."

<Configurations>

In this seventh embodiment, while an actuating signal (G_OVDPOR) is "ON," a first control unit (60) performs turn-on control to allow the inverter circuit (40) to be in a "zero-vector" state. In other words, the inverter circuit (40) is brought in the state of the vector V0 where the lower-arm switching elements (44a to 46a) are all on and the upper-arm switching elements (41a to 43a) are all off, or in the state of the vector V7 where the upper-arm switching elements (41a to 43a) are all on and the lower-arm switching elements (44a to 46a) are all off.

<Operation>

For example, if, at time t3 shown in the timing chart of FIG. 2, the actuating signal (G_OVDPOR) switches from "OFF" to "ON," the first control unit (60) allows the inverter circuit (40) to be in the "zero-vector" state. Thus, all of the three-phase output nodes of the inverter circuit (40) are at the same potential as that of the negative or positive electrode of the capacitor (31). This allows the voltage between each pair of the output nodes of the inverter circuit (40) to be substantially zero. Thus, the output power from the inverter circuit (40) becomes substantially zero, and the average output power from the inverter circuit (40) during the turn-on control also becomes substantially zero.

The other configuration and operation of this embodiment are the same as, or similar to, those of the sixth embodiment. Thus, the detailed description thereof will be omitted.

In this seventh embodiment, during the turn-on control, the inverter circuit (40) is in the state of either the vector V0 or V7. However, the period during which the turn-on control is performed may include a period during which the inverter circuit (40) is in the state of the vector V0 and a period during which the inverter circuit (40) is in the state of the vector V7.

Eighth Embodiment

<Configurations>

Figure 14:
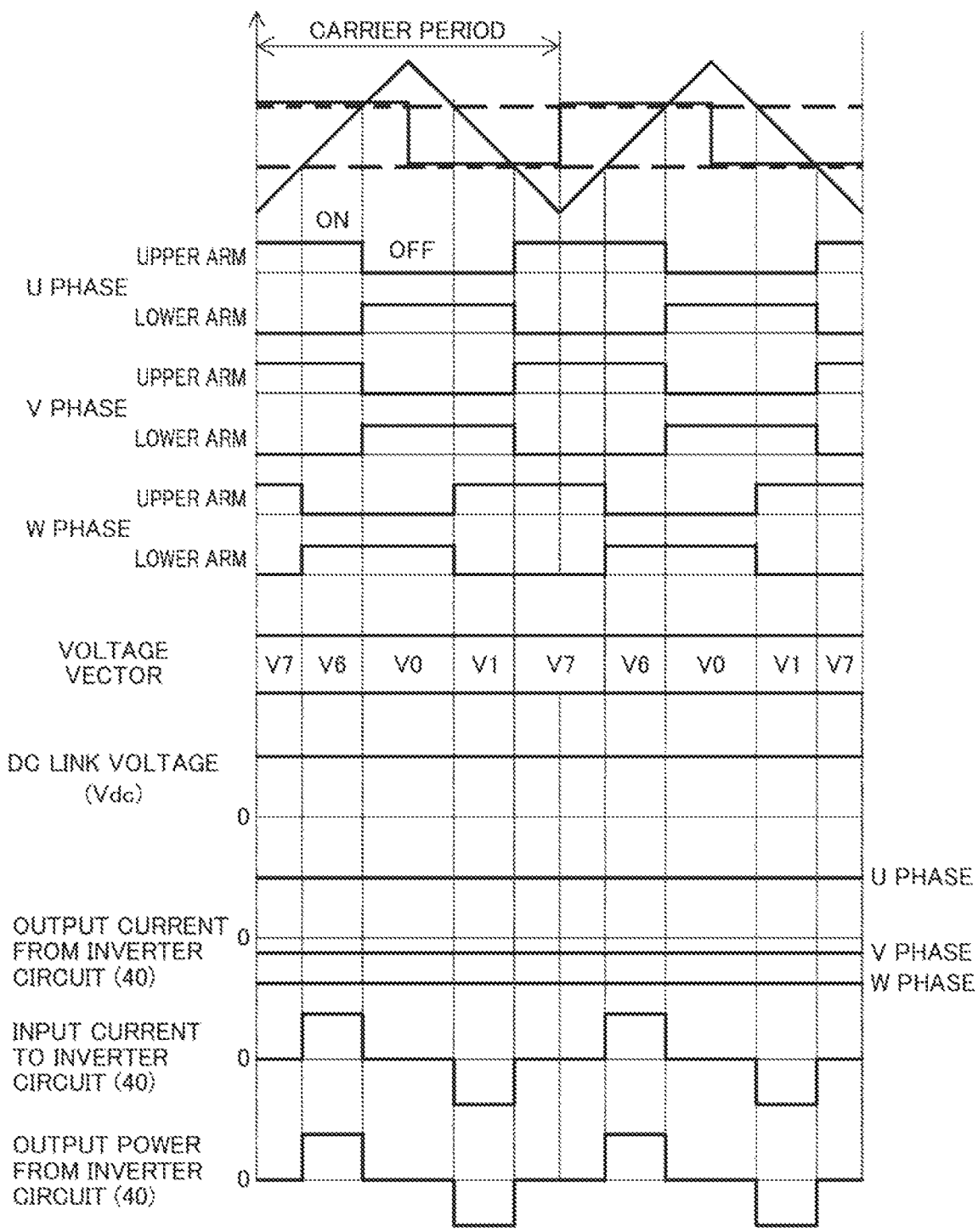
FIG. 14 is a timing chart showing how circuits operate in an eighth embodiment.

In this eighth embodiment, while an actuating signal (G_OVDPOR) is "ON," a first control unit (60) performs turn-on control to switch output power from an inverter circuit (40) between positive and negative values during each of switching periods for switching elements (41a to 46a) so that the average output power from the inverter circuit (40) during the switching period is substantially zero. Specifically, as shown in FIG. 14, turn-on control is performed to cause the state of the inverter circuit (40) to transition in the order of vector V7→vector V6→vector V0→vector V1→vector V7 in each of carrier periods, i.e., each of the switching periods. When the associated switching elements (41a to 46a) are to be turned on or off, a dead time during which the upper-arm switching elements (41a to 43a) and the lower-arm switching elements (44a to 46a) are all off is actually provided. However, FIG. 14 does not show the dead time. In addition, FIG. 14 does not illustrate changes in the DC link voltage Vdc and output currents from the inverter circuit (40) within the carrier period for ease of explanation. The period during which the inverter circuit (40) is in the state of each of the vectors V1 and V6 during the turn-on control is set to prevent the voltage of the capacitor (31) from exceeding the withstand voltage.

The turn-on control is performed to satisfy the following formula (3), where Id is the d-axis current of the load (2) during the turn-on control, Iq is the q-axis current of the load (2), Im is the minimum magnitude of the d-axis current causing irreversible demagnetization of a magnet of the load (2), Φm is the magnetic flux of the magnet, and Ld is the d-axis inductance of the load (2). This prevents the magnet of the load (2) from being irreversibly demagnetized.

$$(Id+\Phi m/Ld)^2+Iq^2<Im^2 \tag{3}$$

<Operation>

In general, the input current to the inverter circuit (40) depends on the voltage vector and the output currents from the inverter circuit (40). In the example of FIG. 14, among the output currents from the inverter circuit (40), the U-phase current Iu is positive, and the V-phase current Iv and the W-phase current Iw are negative. In this case, if the inverter circuit (40) is in the state of the vector V6, the input current to the inverter circuit (40) is obtained by inverting the sign of the W-phase current Iw. If the inverter circuit (40) is in the state of the vector V1, the input current corresponds to the W-phase current. If the inverter circuit (40) is in the state of the vector V0 or V7, the input current reaches zero amperes. The period during which the vector V6 appears during each carrier period is equal to the period during which the vector V1 appears during the carrier period. Thus, as indicated by the chain double-dashed arrow in FIG. 13, the vectors V6 and V1 are equal in magnitude. The output power from the inverter circuit (40) is equal to the input power to the inverter circuit (40) if a circuit loss is ignored. In FIG. 14, the input power to (output power from) the inverter circuit (40) is the product of the DC link voltage Vdc and the input current to the inverter circuit (40). The product of the time and the output power from (input power to) the inverter circuit (40) (the amount of power) obtained while the inverter circuit (40) is in the state of the vector V6 is equal in absolute value to, and different in polarity from, that of the time and the output power from (input power to) the inverter circuit (40) obtained while the inverter circuit (40) is in the state of the vector V1. While the inverter circuit (40) is in the state of the vector V0 or V7, the output power is zero. Thus, the average (time-average) output power is zero. The foregoing relationship is true regardless of a combination of the polarities of the phase currents.

The other configuration and operation of this embodiment are the same as, or similar to, those of the sixth embodiment. Thus, the detailed description thereof will be omitted.

First Variation of Eighth Embodiment

<Configurations>

Figure 15:
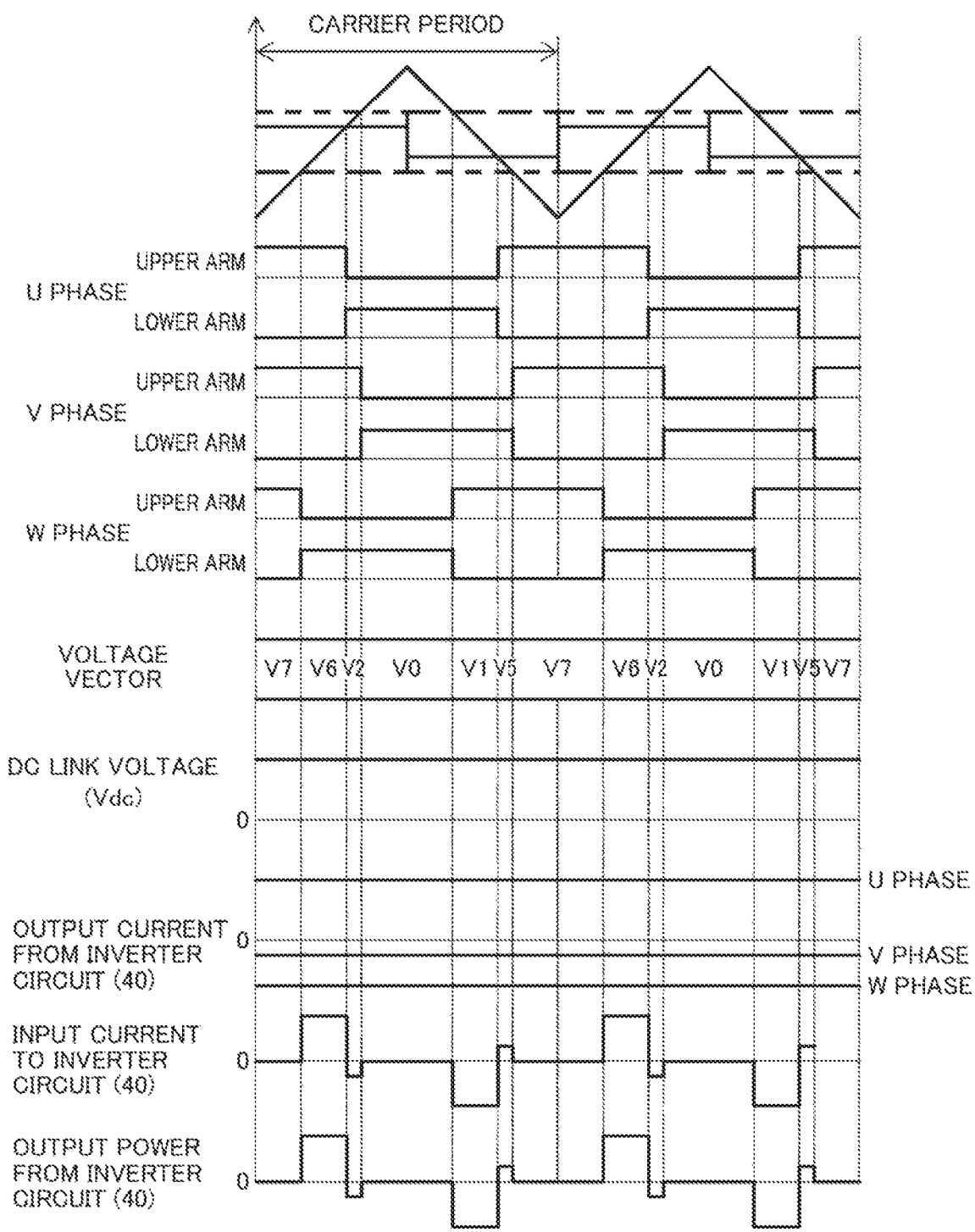
FIG. 15 is a timing chart showing how circuits operate in a first variation of the eighth embodiment.

In a first variation of the eighth embodiment, as shown in FIG. 15, a first control unit (60) performs turn-on control to cause the state of an inverter circuit (40) to transition in the order of vector V7→vector V6→vector V2→vector V0→vector V1→vector V5→vector V7 in each of carrier periods, i.e., each of switching periods. FIG. 15 does not also illustrate the dead time and changes in the DC link voltage Vdc and output currents from the inverter circuit (40) within the carrier period. The period during which the inverter circuit (40) is in the state of each of the vectors V1, V2, V5, and V6 during the turn-on control is set to prevent the voltage of the capacitor (31) from exceeding the withstand voltage.

<Operation>

Also in the example of FIG. 15, among the output currents from the inverter circuit (40), the U-phase current Iu is positive, and the V-phase current Iv and the W-phase current Iw are negative. In this case, if the inverter circuit (40) is in the state of the vector V6, an input current to the inverter circuit (40) is obtained by inverting the sign of the W-phase current Iw. If the inverter circuit (40) is in the state of the vector V2, the input current corresponds to the V-phase current Iv. If the inverter circuit (40) is in the state of the vector V1, the input current corresponds to the W-phase current Iw. If the inverter circuit (40) is in the state of the vector V5, the input current is obtained by inverting the sign of the V-phase current Iv. If the inverter circuit (40) is in the state of the vector V0 or V7, the input current reaches zero amperes. The period during which the vector V6 appears during each carrier period is equal to the period during which the vector V1 appears during the carrier period, and the period during which the vector V2 appears during the carrier period is equal to the period during which the vector V5 appears during the carrier period. Thus, as indicated by the chain double-dashed arrow in FIG. 13, the vectors V6 and V1 are equal in magnitude, and as indicated by the chain arrow in FIG. 13, the vectors V2 and V5 are equal in magnitude. The output power from the inverter circuit (40) is equal to the input power to the inverter circuit (40) if a circuit loss is ignored. Thus, the average (time-average) output power is zero. The foregoing relationship is true regardless of a combination of the polarities of the phase currents.

The other configuration and operation of this embodiment are the same as, or similar to, those of the eighth embodiment. Thus, the detailed description thereof will be omitted.

Second Variation of Eighth Embodiment

<Configurations>

Figure 16:
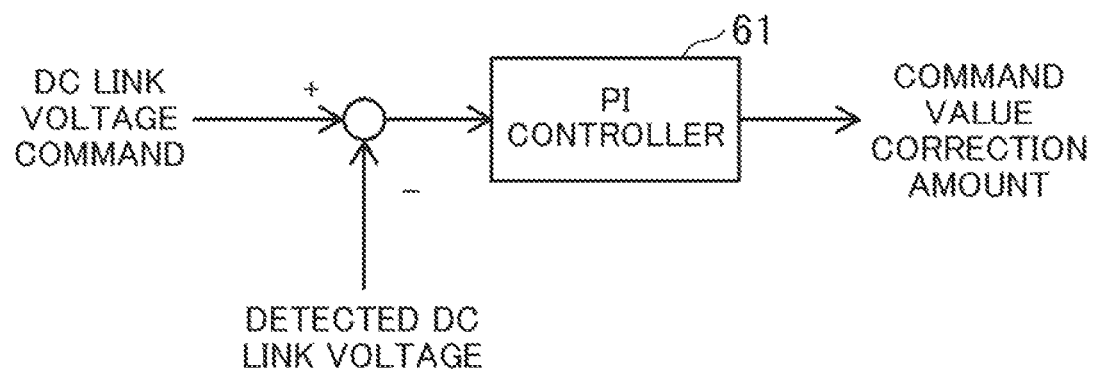
FIG. 16 is a functional block diagram showing how a first control unit functions to control switching signals.

In a second variation of the eighth embodiment, if an actuating signal (G_OVDPOR) is "ON," and an inverter circuit (40) is in the state of either one of a pair of vectors pointing in opposite directions, a first control unit (60) controls switching signals for controlling switching elements (41a to 46a) based on the DC link voltage (Vdc) detected by a voltage detector (32) and a DC link voltage command, as shown in FIG. 16. Specifically, as shown in the block diagram of FIG. 16, the first control unit (60) includes a PI controller (61). If the inverter circuit (40) is in the state of either one of the vectors V6 and V1, the first control unit (60) adds a command value correction amount which is calculated by the PI controller (61) based on the deviation between the DC link voltage (Vdc) and the DC link voltage command, to each of U-phase, V-phase, and W-phase modulated waves.

In this second variation, the input of the PI controller (61) may be the deviation between the average current flowing between the inverter circuit (40) and the capacitor (31) during the switching period and the average current command. The average current command is set to prevent the DC link voltage (Vdc) from being an overvoltage. To achieve such settings, a PI controller for a DC link voltage (Vdc) may include the PI controller (61) as a minor loop. The DC link voltage command is set to be lower than or equal to the overvoltage. A current detector that detects the input current to the inverter circuit (40) may be an inexpensive current detector including a shunt resistance provided for a DC portion of the power conversion device (10). When the output current from the inverter circuit (40) detected by the current detector becomes zero, all of the switching elements (41a to 46a) may be turned off.

Third Variation of Eighth Embodiment

<Configurations>

In a third variation of the eighth embodiment, a power conversion device (10) includes a current detector (not shown) that detects an output current from an inverter circuit (40), i.e., a current flowing between the inverter circuit (40) and the capacitor (31). A first control unit (60) calculates output power from the inverter circuit (40) based on the current detected by the current detector and the DC link voltage (Vdc) detected by the voltage detector (32), and calculates the command value correction amount so that the output power approaches zero during the next switching period (carrier period). Then, the command value correction amount is added to each of the U-phase, V-phase, and W-phase modulated waves. The current detector may be an inexpensive current detector including a shunt resistance provided for a DC portion of the power conversion device (10).

Ninth Embodiment

<Configurations>

Figure 17:
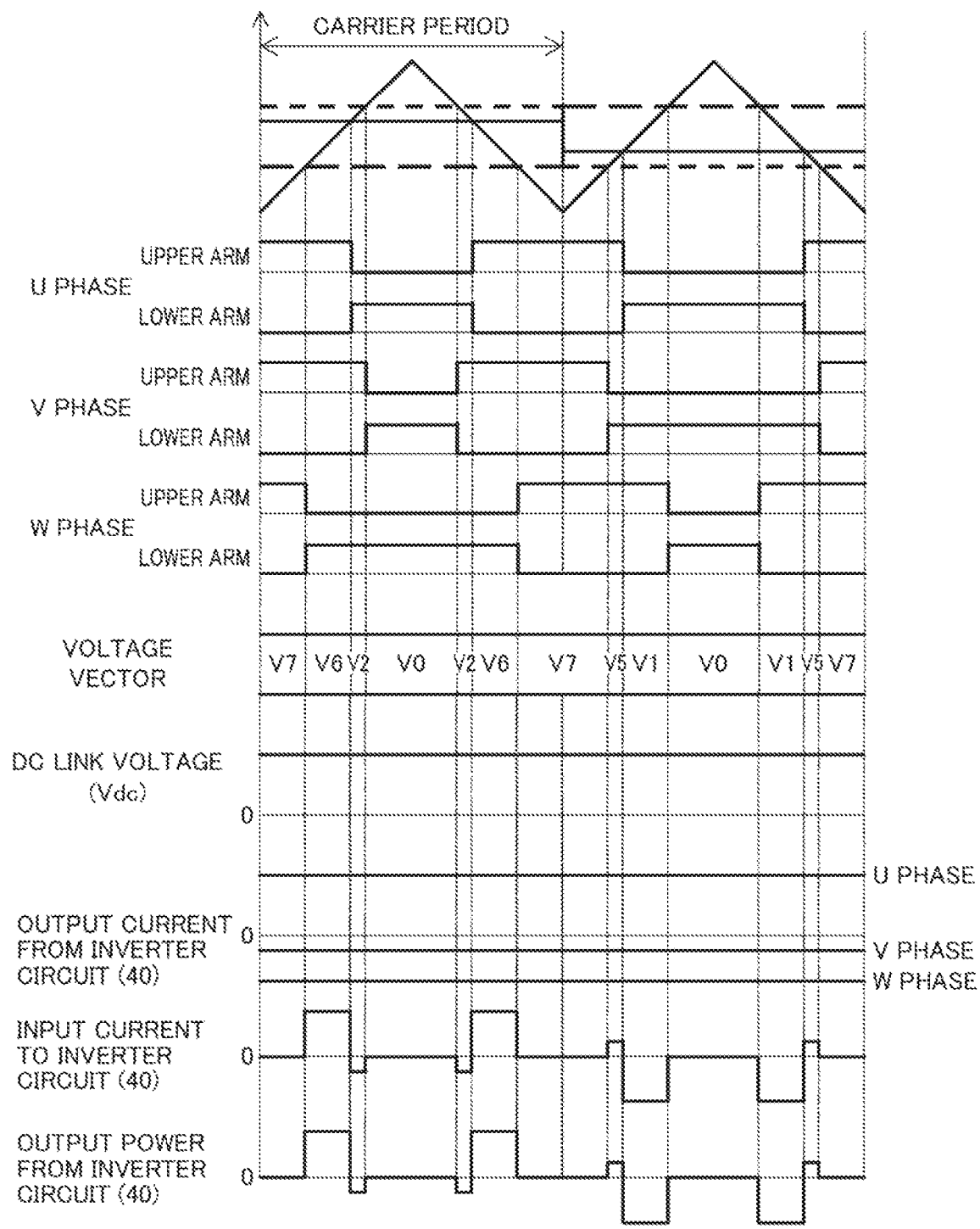
FIG. 17 is a timing chart showing how circuits operate in a ninth embodiment.

In this ninth embodiment, while an actuating signal (G_OVDPOR) is "ON," a first control unit (60) performs turn-on control to switch output power from an inverter circuit (40) between positive and negative values during two successive ones of switching periods (carrier periods) for switching elements (41a to 46a) so that the average output power from the inverter circuit (40) during these switching periods is substantially zero. Specifically, as shown in FIG. 17, turn-on control is performed to cause the state of the inverter circuit (40) to transition in the order of vector V7→vector V6→vector V2→vector V0→vector V2→vector V6→vector V7 in an earlier one of the two successive switching periods and to transition in the order of vector V7→vector V5→vector V1→vector V0→vector V1→vector V5→vector V7 in the other later switching period. The period during which the inverter circuit (40) is in the state of each of the vectors V1, V2, V5, and V6 during the turn-on control is set to prevent the voltage of the capacitor (31) from exceeding the withstand voltage.

<Operation>

In the example of FIG. 17, among output currents from the inverter circuit (40), the U-phase current Iu is positive, and the V-phase current Iv and the W-phase current Iw are negative. In this case, if the inverter circuit (40) is in the state of the vector V6, an input current to the inverter circuit (40) is obtained by inverting the sign of the W-phase current Iw. If the inverter circuit (40) is in the state of the vector V2, the input current corresponds to the V-phase current Iv. If the inverter circuit (40) is in the state of the vector V1, the input current corresponds to the W-phase current Iw. If the inverter circuit (40) is in the state of the vector V5, the input current is obtained by inverting the sign of the V-phase current Iv. If the inverter circuit (40) is in the state of the vector V0 or V7, the input current reaches zero amperes. The period during which the vector V6 appears during one of the two successive switching periods is equal to the period during which the vector V1 appears during the other switching period, and the period during which the vector V2 appears during the one of the switching periods is equal to the period during which the vector V5 appears during the other switching period. Thus, as indicated by the chain double-dashed arrow in FIG. 13, the vectors V6 and V1 are equal in magnitude, and as indicated by the chain arrow in FIG. 13, the vectors V2 and V5 are equal in magnitude. Thus, the product of the time and the output power from (input power to) the inverter circuit (40) (the amount of power) obtained while the inverter circuit (40) is in the state of the vector V6 is equal in absolute value to, and different in polarity from, that of the time and the output power from (input power to) the inverter circuit (40) obtained while the inverter circuit (40) is in the state of the vector V1. The product of the time and the output power from (input power to) the inverter circuit (40) (the amount of power) obtained while the inverter circuit (40) is in the state of the vector V2 is equal in absolute value to, and different in polarity from, that of the time and the output power from (input power to) the inverter circuit (40) obtained while the inverter circuit (40) is in the state of the vector V5. While the inverter circuit (40) is in the state of the vector V0 or V7, the output power is zero. Thus, the average (time-average) output power during these two switching periods is zero.

The other configuration and operation of this embodiment are the same as, or similar to, those of the eighth embodiment. Thus, the detailed description thereof will be omitted.

In this ninth embodiment, the first control unit (60) performs turn-on control so that the average output power from the inverter circuit (40) during two successive ones of the switching periods is substantially zero. Alternatively, the first control unit (60) may perform turn-on control so that the average output power from the inverter circuit (40) during three or more successive ones of the switching periods is substantially zero.

Tenth Embodiment

<Configurations>

Figure 18:
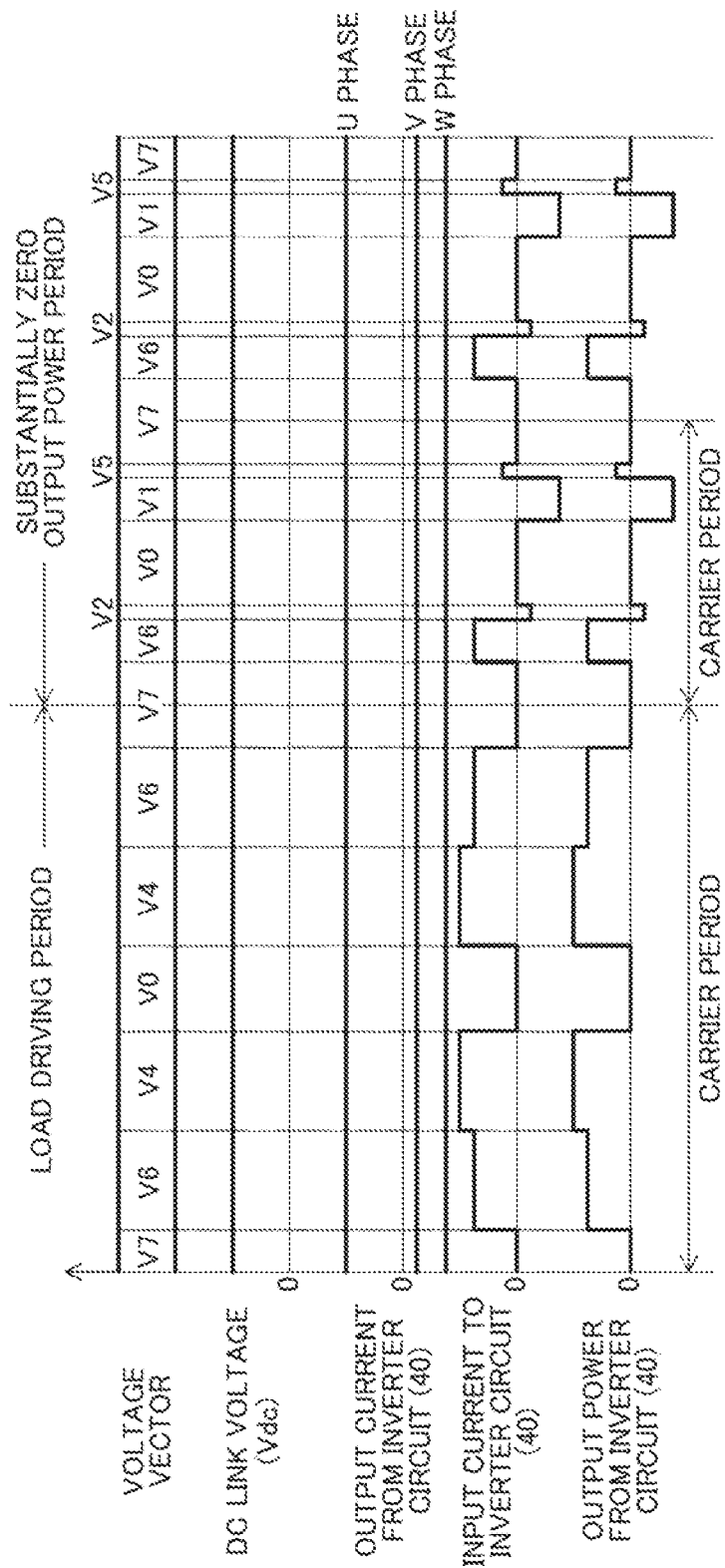
FIG. 18 is a timing chart showing how circuits operate in a tenth embodiment.

In this tenth embodiment, as shown in FIG. 18, a first control unit (60) allows a switching period during turn-on control to be shorter than another switching period during supply of power to the load (2).

The other configuration and operation of this embodiment are the same as, or similar to, those of the first variation of the eighth embodiment. Thus, the detailed description thereof will be omitted.

<Advantages>

Thus, in this tenth embodiment, the switching period during the turn-on control is shorter than the another switching period during the supply of power to the load (2). This allows the ripple of the DC link voltage (Vdc) to be smaller, and allows the degree to which the voltage of the capacitor (31) rises to be more reliably lower during the turn-on control, than if the switching period during the turn-on control is equal to the another switching period during the supply of power to the load (2).

Also in each of the eighth embodiment, the second and third variations of the eighth embodiment, and the ninth embodiment, the first control unit (60) may set the switching period during turn-on control to be shorter than the another switching period during the supply of power to the load (2).

Variation of Tenth Embodiment

<Configurations>

Figure 19:
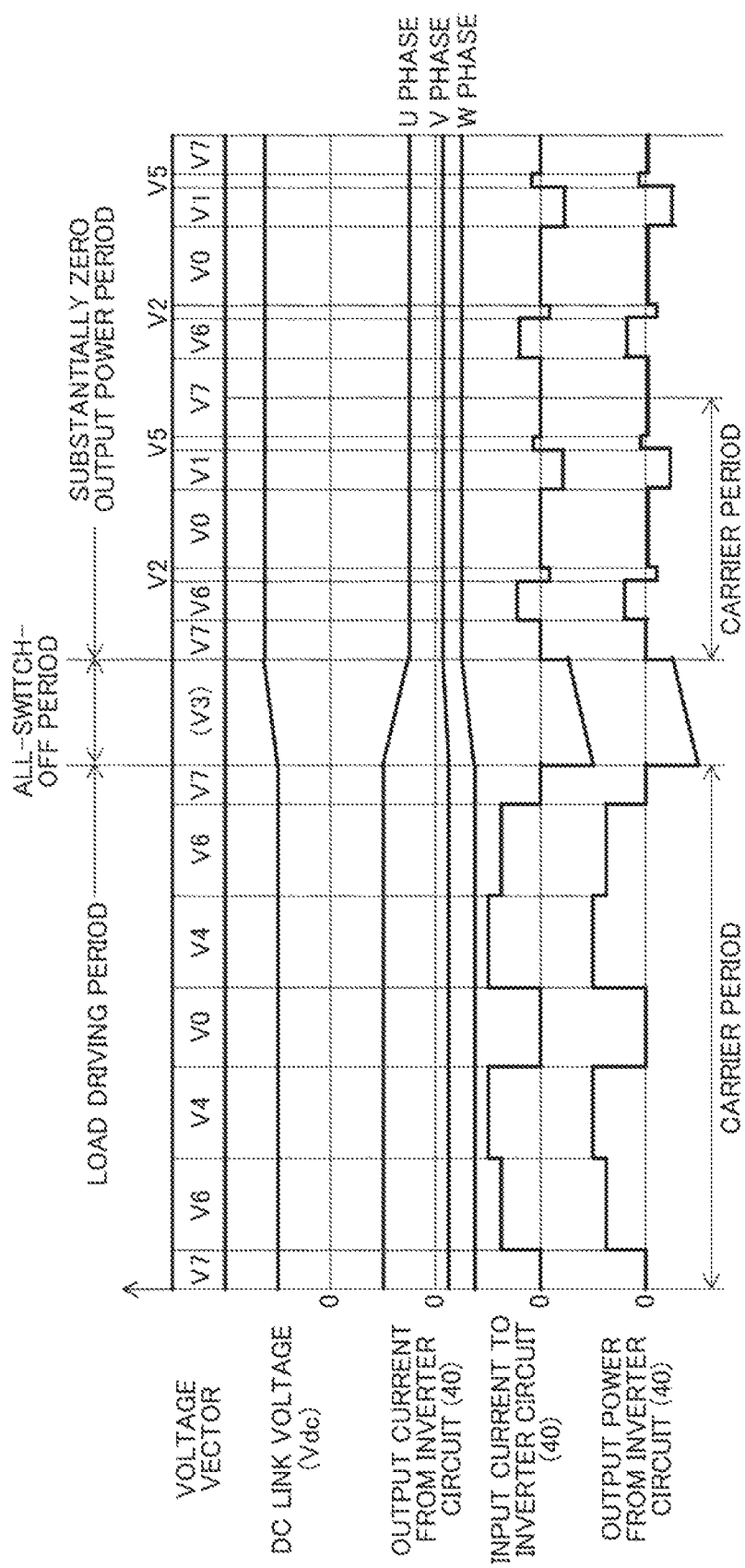
FIG. 19 is a timing chart showing how circuits operate in a variation of the tenth embodiment.

In a variation of this tenth embodiment, as shown in FIG. 19, an all-switch-off period during which all of switching elements (41a to 46a) of an inverter circuit (40) are turned off is provided between a load driving period during which power is supplied to the load (2) and a substantially zero output power period during which turn-on control is performed. The all-switch-off period is set to be short enough to prevent the DC link voltage (Vdc) from exceeding the withstand voltage of the elements connected to the DC link unit (30).

During each of the load driving period and the substantially zero output power period, the DC link voltage (Vdc) varies in the same manner as during the all-switch-off period. However, FIG. 19 shows the average DC link voltage without showing the variation of the DC link voltage.

The other configuration and operation of this embodiment are the same as, or similar to, those of the tenth embodiment. Thus, the detailed description thereof will be omitted.

Other Embodiments

The AC power source (1) may be a single-phase power source instead of a three-phase power source. In the case of the single-phase power source, the ripple component of the DC link voltage according to the frequency of the power supply voltage (Vac) has a frequency that is about twice that of the power supply voltage (Vac). In this case, the DC link voltage (Vdc) pulsates so that its maximum value is higher than or equal to twice its minimum value.

The capacitance of the capacitor (31) does not need to satisfy the foregoing formula (1).

The switching elements (41a to 46a) of the inverter circuit (40) may be mainly made of a material except a wide-bandgap semiconductor.

The semiconductor element (52) of the overvoltage protection circuit (50) may be mainly made of a material except a wide-bandgap semiconductor.

Only the inverter circuit (40) and the overvoltage protection circuit (50) do not always have to be housed in the same package (P1). Another circuit may be housed in the same package (P1) as the inverter circuit (40) and the overvoltage protection circuit (50).

In the sixth embodiment, an inverter circuit (40) with a different configuration from that of the sixth embodiment may be used to allow current from the load (2) to flow back through a semiconductor element included in the inverter circuit (40) without passing the current through the capacitor (31). This may allow the output power from the inverter circuit (40) to be substantially zero. Examples of such an inverter circuit with a different configuration include a multilevel inverter.

In each of the first to tenth embodiments and the variations thereof, the switching signals for controlling the switching elements (41a to 46a) are generated by PWM control. However, the switching signals may be generated by delaying pulse signals supplied from a common pulse signal source for each phase by different phases.

In addition, in each of the eighth to tenth embodiments and the variations thereof, the turn-on control is performed to satisfy the formula (3). However, the turn-on control may be performed to satisfy the following formula (4) instead of this formula (3). In the formula (4), Idq is the magnitude of the dq-axis current vector of the load during the turn-on control.

$$Idq < Im - \Phi m / Ld \quad (4)$$

Thus, the magnet of the load (2) is reliably prevented from being irreversibly demagnetized even if the location of the rotor is not accurately determined, such as if synchronization in motor control is lost.

To determine the magnitude of the dq-axis current vector, it is recommended that the root sum square of each of the phase currents Iu, Iv, and Iw of the inverter circuit (40) be calculated. While the location of the rotor is not accurately determined, the d-axis current Id and the q-axis current Iq are hardly determined. In contrast, if the calculation is performed using the phase currents of the inverter circuit (40), only the detected currents can be used. The calculation determines the same value as the magnitude of the dq-axis current vector. Outputting a voltage vector other than the zero vectors allows the phase currents on the output side of the inverter circuit (40) to be detected on the input side of the inverter circuit (40).

In each of the sixth to tenth embodiments and the variations thereof, the first control unit (60) performs the turn-on control so that the average output power from the inverter circuit (40) is substantially zero. However, the first control unit (60) may perform another control, as the turn-on control, to turn at least one of the switching elements (41a to 46a) on so that the absolute value of the average output power from the inverter circuit (40) is less than if all of the switching elements (41a to 46a) are turned off.

In each of the sixth to tenth embodiments and the variations thereof, the average output power from the inverter circuit (40) is substantially zero while the actuating signal (G_OVDROR) is "ON." However, the average output power from the inverter circuit (40) may be substantially zero while the supply of power to the load (2) is stopped. This increases the chance of stopping operating the load (2) to deactivate the overvoltage protection circuit (50), thus increasing the life of the overvoltage protection circuit (50).

While the embodiments have been described above, it will be understood that various changes in form and details can be made without departing from the spirit and scope of the claims. The above embodiments and variations may be appropriately combined or replaced as long as the functions of the target of the present disclosure are not impaired.

The present disclosure is useful as a power conversion device.

| EXPLANATION OF REFERENCES | |
|---|---|
| 10 | Power Conversion Device |
| 20 | Converter Circuit |
| 31 | Capacitor |
| 40 | Inverter Circuit |
| 41a to 43a | Upper-arm Switching Element |
| 44a to 46a | Lower-arm Switching Element |
| 50 | Overvoltage Protection Circuit |
| 51 | Resistor |
| 52 | Semiconductor Element |
| 60 | First Control Unit (Control Circuit) |
| 70 | Second Control Unit (Control Circuit) |
| 80 | Substrate |
| Vdc | DC Link Voltage (Input Voltage) |

The invention claimed is:

1. A power conversion device comprising:
a converter circuit configured to convert AC electric power output from an AC power source into DC power;
an inverter circuit including a plurality of switching elements, and configured to convert the DC power into AC power to supply the AC power to a load;
a capacitor connected in parallel to each of the converter circuit and the inverter circuit between the converter circuit and the inverter circuit, the capacitor allowing variation of an output voltage from the converter circuit, the capacitor absorbing variation of an output voltage from the inverter circuit due to a switching operation;

an overvoltage protection circuit including a resistor and a semiconductor element connected in series to each other, the overvoltage protection circuit being connected in parallel to the capacitor, the overvoltage protection circuit being configured to protect the inverter circuit from an overvoltage applied to the inverter circuit; and a control circuit configured to control the inverter circuit and the overvoltage protection circuit, wherein the following formula is satisfied:

$C(Vc1^2 - Vc2^2)/2 < E$ where C represents a capacitance of the capacitor, Vc1 represents a withstand voltage of the capacitor, Vc2 represents a peak voltage of the capacitor during the switching operation, and E represents a maximum magnetic energy that is capable of being stored in the load.

2. The power conversion device of claim 1, wherein the converter circuit, the inverter circuit, the overvoltage protection circuit, and the control circuit are mounted on an identical substrate.

3. The power conversion device of claim 1, wherein at least the inverter circuit and the overvoltage protection circuit are housed in an identical package.

4. The power conversion device of claim 1, wherein a capacitance C of the capacitor is determined to satisfy the following formula based on a power supply voltage Vac of the electric power and a maximum power Pmax of the AC power:

$$C \le 350 \times 10^{-6} \times \frac{Pmax}{Vac^2}.$$ [Formula 3]

5. The power conversion device of claim 1, wherein the control circuit activates the overvoltage protection circuit when supply of power from the inverter circuit to the load is stopped.

6. The power conversion device of claim 1, wherein the control circuit activates the overvoltage protection circuit in a portion of a period during which the capacitor is charged immediately after a sudden rise in a voltage of the AC power source.

7. The power conversion device of claim 1, wherein the control circuit activates the overvoltage protection circuit in a portion of a period during which resonance occurs in a circuit including the capacitor.

8. The power conversion device of claim 1, wherein the control circuit turns the semiconductor element on to activate the overvoltage protection circuit, if an input voltage applied through the capacitor to the inverter circuit is higher than or equal to a first predetermined value, turns the semiconductor element oft to deactivate the overvoltage protection circuit, if the input voltage applied to the inverter circuit is lower than or equal to a second predetermined value after activating the overvoltage protection circuit, and sets the second predetermined value to be lower than the first predetermined value.

9. The power conversion device of claim 1, wherein the control circuit turns the semiconductor element on to activate the overvoltage protection circuit, if an input voltage applied through the capacitor to the inverter circuit is higher than or equal to a third predetermined value, and turns the semiconductor element off to deactivate the overvoltage protection circuit, if a predetermined time has elapsed since the activation of the overvoltage protection circuit.

10. The power conversion device of claim 1, wherein the control circuit turns the semiconductor element on to activate the overvoltage protection circuit, if an input voltage applied through the capacitor to the inverter circuit that is stopping the switching operation is higher than or equal to a fourth predetermined value, and switches at least one of the switching elements of the inverter circuit that is stopping the switching operation from off to on after activating the overvoltage protection circuit.

11. The power conversion device of claim 10, wherein after turning at least one of the switching elements on, the control circuit turns the semiconductor element of the overvoltage protection circuit off to deactivate the overvoltage protection circuit.

12. The power conversion device of claim 1, wherein the switching elements are mainly made of a widebandgap semiconductor containing silicon carbide, gallium nitride, or diamond.

13. The power conversion device of claim 1, wherein the semiconductor element is mainly made of a widebandgap semiconductor containing silicon carbide, gallium nitride, or diamond.

14. The power conversion device of claim 1, wherein a capacitance of the capacitor is set such that voltage variation of the capacitor during a switching period for the switching elements is 1/10 or less of an average voltage of the capacitor.

15. A power conversion device comprising:

a converter circuit configured to convert AC electric power output from an AC power source into DC power;

an inverter circuit including a plurality of switching elements, and configured to convert the DC power into AC power to supply the AC power to a load;

a capacitor connected in parallel to each of the converter circuit and the inverter circuit between the converter circuit and the inverter circuit, the capacitor allowing variation of an output voltage from the converter circuit, the capacitor absorbing variation of an output voltage from the inverter circuit due to a switching operation;

an overvoltage protection circuit being connected in parallel to the capacitor, the overvoltage protection circuit being configured to protect the inverter circuit from an overvoltage applied to the inverter circuit; and a control circuit configured to control the inverter circuit, wherein during activation of the overvoltage protection circuit, the control circuit performs turn-on control to turn at least one of the switching elements on so that an absolute value of an average output power from the inverter circuit is less than if all of the switching elements are turned off.

16. The power conversion device of claim 15, wherein the turn-on control is performed so that the average output power from the inverter circuit is substantially zero.

17. The power conversion device of claim 15, wherein the turn-on control allows the inverter circuit to be in a zero-vector state.

18. The power conversion device of claim 15, wherein the turn-on control is performed to switch the output power from the inverter circuit between positive and negative values during a switching period for the switching elements so that the average output power from the inverter circuit during the switching period is substantially zero.

19. The power conversion device of claim 15, wherein the turn-on control is performed to switch the output power from the inverter circuit between positive and negative values during a plurality of successive ones of switching periods for the switching elements so that the average outputpower from the inverter circuit during the successive ones of the switching periods is substantially zero.

20. The power conversion device of claim 15, wherein the turn-on control is performed to control switching signals for controlling the switching elements, based on at least one of a current flowing from the inverter circuit to the capacitor or a voltage of the capacitor.

21. The power conversion device of claim 15, wherein the switching period for the switching elements during the turn-on control is set to be shorter than the switching period during supply of power to the load.

22. The power conversion device of claim 14, wherein the load is a magnet motor, and
the turn-on control is performed to satisfy the following formula:

$$(Id+\Phi m/Ld)^2+Iq^2<Im^2$$

where Id is a d-axis current of the load during the turn-on control, Iq is a q-axis current of the load, Im is a minimum magnitude of the d-axis current causing irreversible demagnetization of a magnet of the load, Φm is a magnetic flux of the magnet, and Ld is a d-axis inductance of the load.

23. The power conversion device of claim 15, wherein the turn-on control is performed to satisfy the following formula:

$$Idq<Im-\Phi/Ld$$

where Idq is a dq-axis current vector of the load during the turn-on control, Im is a minimum magnitude of a d-axis current causing irreversible demagnetization of a magnet of the load, Φm is a magnetic flux of the magnet, and Ld is a d-axis inductance of the load.

24. A power conversion device comprising:
an inverter circuit including a plurality of switching elements, and configured to convert DC power into AC power to supply the AC power to a load; and
an overvoltage protection circuit including a resistor and a semiconductor element connected in series to each other, the overvoltage protection circuit being connected in parallel to a DC portion of the inverter circuit, the overvoltage protection circuit being configured to protect the inverter circuit from an overvoltage applied to the inverter circuit,
the inverter circuit and the oversioltage protection circuit being housed in an identical package,
wherein the overvoltage protection circuit is activated when supply of power from the inverter circuit to the load is stopped.

25. The power conversion device of claim 24, wherein the switching elements are mainly made of a wide-bandgap semiconductor containing silicon carbide, gallium nitride, or diamond.

26. The power conversion device of claim 24, wherein the semiconductor element is mainly made of a wide-bandgap semiconductor containing silicon carbide, gallium nitride, or diamond.

* * * * *